United States Patent
Choi et al.

(10) Patent No.: US 8,225,167 B2
(45) Date of Patent: Jul. 17, 2012

(54) RECEIVING/TRANSMITTING SYSTEM AND DATA PROCESSING METHOD IN THE RECEIVING/TRANSMITTING SYSTEM

(75) Inventors: In Hwan Choi, Seoul (KR); Byoung Gill Kim, Seoul (KR); Won Gyu Song, Seoul (KR); Jin Woo Kim, Seoul (KR); Hyoung Gon Lee, Seoul (KR); Hyo Sang Ko, Seoul (KR)

(73) Assignee: LG Electronics Inc., Seoul (KR)

( * ) Notice: Subject to any disclaimer, the term of this patent is extended or adjusted under 35 U.S.C. 154(b) by 550 days.

(21) Appl. No.: 12/432,020

(22) Filed: Apr. 29, 2009

(65) Prior Publication Data

US 2009/0271682 A1    Oct. 29, 2009

Related U.S. Application Data

(60) Provisional application No. 61/048,557, filed on Apr. 29, 2008, provisional application No. 61/053,017, filed on May 14, 2008.

(30) Foreign Application Priority Data

Apr. 28, 2009    (KR) .................. 10-2009-0037296

(51) Int. Cl.
*H03M 13/00* (2006.01)
(52) U.S. Cl. ............... 714/752; 714/786; 375/240.25; 375/340
(58) Field of Classification Search .......... 714/752, 714/786; 375/240.25, 340
See application file for complete search history.

(56) References Cited

U.S. PATENT DOCUMENTS

| | | | |
|---|---|---|---|
| 6,211,800 B1 * | 4/2001 | Yanagihara et al. | 341/50 |
| 6,373,534 B1 * | 4/2002 | Yasuki et al. | 348/725 |
| 6,512,759 B1 * | 1/2003 | Hashimoto et al. | 370/347 |
| 6,810,084 B1 * | 10/2004 | Jun et al. | 375/240.28 |
| 6,975,689 B1 * | 12/2005 | McDonald et al. | 375/316 |
| 6,985,537 B1 * | 1/2006 | Milbar | 375/265 |
| 7,096,484 B2 * | 8/2006 | Mao et al. | 725/52 |
| 2007/0086488 A1 | 4/2007 | Kim et al. | |

FOREIGN PATENT DOCUMENTS

WO    2007/145410    12/2007

* cited by examiner

*Primary Examiner* — Esaw Abraham
(74) *Attorney, Agent, or Firm* — Lee, Hong, Degerman, Kang & Waimey

(57) ABSTRACT

A receiving system and a data processing method are disclosed. The receiving system includes: a receiving unit receiving a broadcast signal including a first group comprising mobile service data, known data and signaling data; a signaling decoder decoding the signaling data from the received broadcast signal; a demodulator demodulating the received broadcast signal based upon the known data; an equalizer channel-equalizing the demodulated broadcast signal based upon the known data; a turbo decoder performing turbo decoding on the mobile service data of the channel-equalized broadcast signal by applying a Serial Concatenated Convolutional Coding (SCCC) mode based upon the signaling data; and an error correction unit performing error correction decoding on the turbo-decoded mobile service data based upon the signaling data.

7 Claims, 30 Drawing Sheets

1 Track = 12 TS packets

1 Sub-Package = 156 TS packets = 13 Tracks

FIG. 18

| | |
|---|---|
| 1st packet of 1st track | 4443333333335555555555555555555555555555555555555555555555555555555555555555555555555555555555555533333333333111111111122222222222222222<br>33333333333355555555555555555555555555555555555555555555555555555555555555555555555555555555555555555555555555555555555555555111111112222 |
| 1st packet of 2nd track | 4445555555553333333333335555555555555555555555555555555555555555555555555555555555555555555533333333333111111111111222222222222222222<br>555555555555555555555555555555555555555555555555555555555555555555555555555555555555555555555555551111111112222222222222 |
| 1st packet of 3rd track | 4445555555555555555533333333333355555555555555555555555555555555555555555555555555555555555555533333333333111111111111222222222222222<br>55555555555555555555555555555555555555555555555555555555555555555555555555555555555555555555555551111111112222222222222 |
| 1st packet of 4th track | 4445555555555555555555555555333333333335555555555555555555555555555555555555555555555555555555555533333333333111111111112222<br>555555555555555555555555555555555555555555555555555555555555555555555555555555555555555555555555551111111112222 |
| 1st packet of 5th track | 4443333333335555555555555555555555555333333333355555555555555555555555555555555555555555555555555555555555533333333333111111111<br>3333333333355555555555555555555555555555555555555555555555555555555555555555555555555555555555555555555555111111111112222222222222 |
| 1st packet of 6th track | 4445555555333333333333333355555555555555555555555555555555555555555555555555555555555555555533333333333111111111111222222222222<br>5555555555555555555555555555555555555555555555555555555555555555555555555555555555555555555551111111112222222222222 |
| 1st packet of 7th track | 4445555555555555333333333333355555555555555555555555555555555555555555555555555555555555555555533333333333311111111112222222222222<br>55555555555555555555555555555555555555555555555555555555555555555555555555555555555555555555551111111112222222222222 |
| 1st packet of 8th track | 4445555555555555555555333333333333355555555555555555555555555555555555555555555555555555555555533333333333311111111112222222222222<br>55555555555555555555555555555555555555555555555555555555555555555555555555555555555555555555551111111112222222222222 |
| 1st packet of 9th track | 44455555555555555555555555555333333333333355555555555555555555555555555555555555555555555555555555555555333333333333111111111<br>3333333355555555555555555555555555555555555555555555555555555555555555555555555555555555555111111111 |
| 1st packet of 10th track | 4443333333333355555555555555555555555555555555555555555555333333333355555555555555555555555555555555555555555555555333333333<br>55555555555555555555555555555555555555555555555555555555555555555555555555555555555555555555555551111111112222222222222 |
| 1st packet of 11th track | 4445555555555333333333355555555555555555555555555555555555555555333333333355555555555555555555555555555555555555555555555533333333333111111111111222222<br>55555555555555555555555555555555555555555555555555555555555555555555555555555555555555555555555551111111112222222222222 |
| 1st packet of 12th track | 4445555555555555555333333333333355555555555555555555555555555555555555555555555555555555555555533333333333111111111111222222222222<br>55555555555555555555555555555555555555555555555555555555555555555555555555555555555555555555555551111111112222222222222 |
| 1st packet of 13th track | 4445555555555555555555555333333333355555555555555555555555555555555555555555555555555555555555553333333333331111111111<br>555555555555555555555555555555555555555555555555555555555555555555555555555555555555555555555551111111111 |

RECEIVING/TRANSMITTING SYSTEM AND DATA PROCESSING METHOD IN THE RECEIVING/TRANSMITTING SYSTEM

This application claims the benefit of U.S. Provisional Application No. 61/048,557, filed on Apr. 29, 2008, which is hereby incorporated by reference as if fully set forth herein. And this application claims the benefit of U.S. Provisional Application No. 61/053,017, filed on May 14, 2008, which is hereby incorporated by reference as if fully set forth herein. Also this application claims the benefit of Korean Application No. 10-2009-0037296, filed on Apr. 28, 2009, which is hereby incorporated by reference.

BACKGROUND OF THE INVENTION

1. Field of the Invention

The present invention relates to a digital broadcasting system for transmitting and receiving digital broadcast signal, and more particularly, to a transmitting system for processing and transmitting digital broadcast signal, and a receiving system for receiving and processing digital broadcast signal and, a method of processing data in the transmitting system and the receiving system.

2. Discussion of the Related Art

The Vestigial Sideband (VSB) transmission mode, which is adopted as the standard for digital broadcasting in North America and the Republic of Korea, is a system using a single carrier method. Therefore, the receiving performance of the digital broadcast receiving system may be deteriorated in a poor channel environment. Particularly, since resistance to changes in channels and noise is more highly required when using portable and/or mobile broadcast receivers, the receiving performance may be even more deteriorated when transmitting mobile service data by the VSB transmission mode.

SUMMARY OF THE INVENTION

Accordingly, the present invention is directed to a digital broadcasting system and a data processing method of the same that substantially obviate one or more problems due to limitations and disadvantages of the related art.

An object of the present invention is to provide a digital broadcasting system and a data processing method of the same that are highly resistant to channel changes and noise.

Another object of the present invention is to provide a transmitting system and a receiving system and a data processing method of the same that can enhance the receiving performance of the mobile service data, by performing turbo-encoding on the mobile service data using at least one of a SCCC method and a PCCC method and transmitting the turbo-encoded mobile service data, and by having the receiving system perform turbo-decoding.

A further object of the present invention is to provide a transmitting system and a receiving system and a data processing method of the same that can enhance the receiving performance of the mobile service data, by transmitting a data packet including known data sequences in each of a pre-determined number of data packets.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a receiving system includes a receiving unit, a controller, a demodulator, an equalizer, a turbo decoder, and an error correction unit. The receiving unit receives a broadcast signal, wherein an M/H service data packet includes known data and signaling data is periodically inserted for each of K number of data packets. The controller detects known data and decodes the signaling data from the received broadcast signal. The demodulator demodulates the received broadcast signal, based upon the known data. The equalizer channel-equalizes the demodulated broadcast signal, based upon the known data. The turbo decoder performs regressive turbo decoding on mobile service data, among the channel-equalized data, by applying at least one of an SCCC mode and a PCCC mode, based upon the signaling data. The error correction unit performs error correction on the mobile service data being turbo-decoded and outputted, based upon the signaling data.

Herein, K number of data packets may include at least one of an M/H service data packet including mobile service data and a main service data packet including main service data. And, a number of M/H service data packets within the K number of data packets may be variable.

In another aspect of the present invention, a data processing method in a receiving system includes receiving a broadcast signal including data packets, wherein an M/H service data packet includes known data and signaling data is periodically inserted for each of K number of data packets, detecting known data and decoding the signaling data from the received broadcast signal, demodulating the received broadcast signal, based upon the known data, channel-equalizing the demodulated broadcast signal, based upon the known data, performing regressive turbo decoding on mobile service data, among the channel-equalized data, by applying at least one of an SCCC mode and a PCCC mode, based upon the signaling data, and performing error correction on the mobile service data being turbo-decoded and outputted, based upon the signaling data.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 18 illustrates exemplary format of a first data packet respective to 13 tracks shown in numbers, the 13 tracks being included in the sub-package shown in FIG. 16;

DETAILED DESCRIPTION OF THE INVENTION

Figure 1:
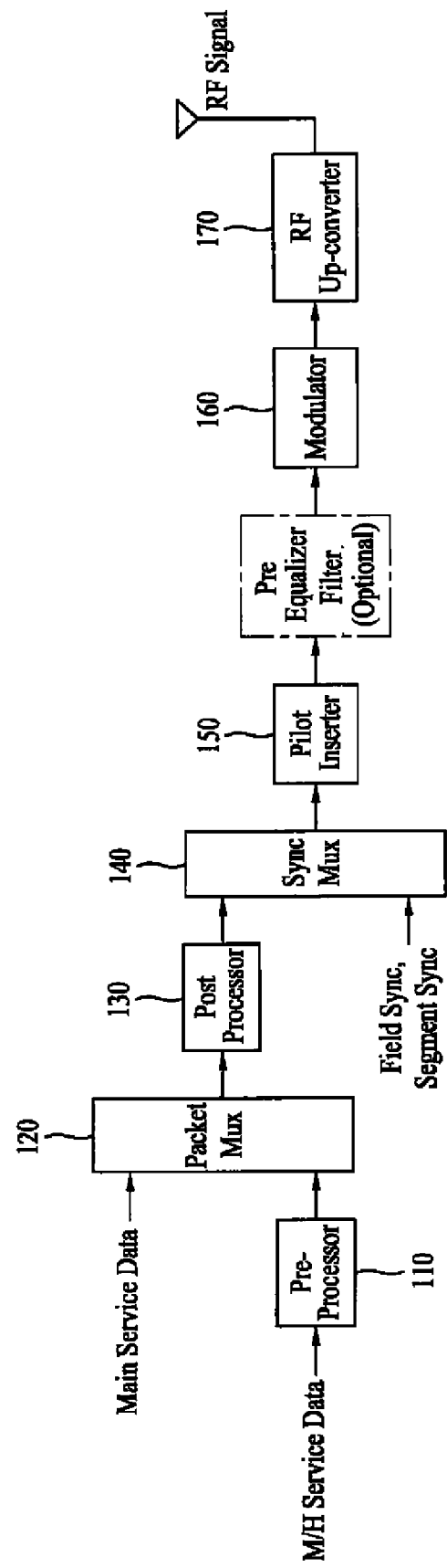
FIG. 1 illustrates a block diagram showing a structure of a transmitting system according to an embodiment of the present invention.

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

Among the terms used in the description of the present invention, main service data correspond to data that can be received by a fixed receiving system and may include audio/video (A/V) data. More specifically, the main service data may include A/V data of high definition (HD) or standard definition (SD) levels and may also include diverse data types required for data broadcasting. Also, the known data correspond to data pre-known in accordance with a pre-arranged agreement between the receiving system and the transmitting system.

Additionally, among the terms used in the present invention, "M/H (or MH)" corresponds to the initials of "mobile" and "handheld" and represents the opposite concept of a fixed-type system. Furthermore, the M/H service data may include at least one of mobile service data and handheld service data, and will also be referred to as "mobile service data" for simplicity. Herein, the mobile service data not only correspond to M/H service data but may also include any type of service data with mobile or portable characteristics. Therefore, the mobile service data according to the present invention are not limited only to the M/H service data.

The above-described mobile service data may correspond to data having information, such as program execution files, stock information, and so on, and may also correspond to A/V data. Most particularly, the mobile service data may correspond to A/V data having lower resolution and lower data rate as compared to the main service data. For example, if an A/V codec that is used for a conventional main service corresponds to a MPEG-2 codec, a MPEG-4 advanced video coding (AVC) or scalable video coding (SVC) having better image compression efficiency may be used as the A/V codec for the mobile service. Furthermore, any type of data may be transmitted as the mobile service data. For example, transport protocol expert group (TPEG) data for broadcasting real-time transportation information may be transmitted as the main service data.

Also, a data service using the mobile service data may include weather forecast services, traffic information services, stock information services, viewer participation quiz programs, real-time polls and surveys, interactive education broadcast programs, gaming services, services providing information on synopsis, character, background music, and filming sites of soap operas or series, services providing information on past match scores and player profiles and achievements, and services providing information on product information and programs classified by service, medium, time, and theme enabling purchase orders to be processed. Herein, the present invention is not limited only to the services mentioned above.

Transmitting System

FIG. 1 illustrates a block diagram showing a general structure of a digital broadcasting transmitting system according to an embodiment of the present invention. The digital broadcast transmitting system according to the present invention includes a pre-processor 110, a packet multiplexer 120, a post-processor 130, a synchronization multiplexer 140, a pilot inserter 150, a modulator 160, and an up-converter 170.

The pre-processor 110 performs an additional encoding process on the inputted mobile service. This is to enable the mobile service data to respond swiftly and strongly against noise and channel changes.

Figure 2:
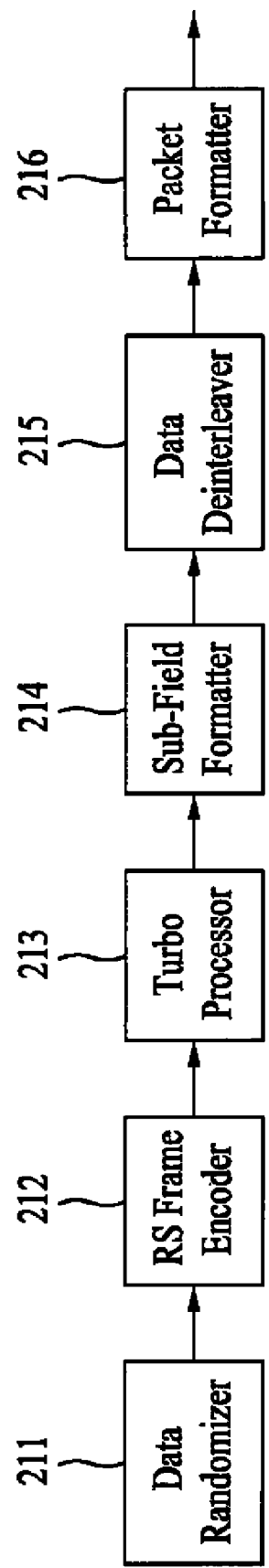
FIG. 2 illustrates a block diagram showing a structure of a pre-processor of the transmitting system shown in FIG. 1 according to an embodiment of the present invention.

FIG. 2 illustrates a block diagram showing an example of the pre-processor 110 according to the present invention. The pre-processor 110 includes a data randomizer 211, a RS frame encoder 212, a turbo processor 213, a sub-field formatter 214, a data deinterleaver 215, and a packet formatter 216.

The data randomizer 211 within the above-described pre-processor 110 performs a randomizing process of on the mobile service data included the inputted mobile service data packet. Then, the data randomizer 211 outputs the randomized mobile service data to the RS frame encoder 212. At this point, since the data randomizer 211 performs the randomizing process on the mobile service data, the randomizing process that is to be performed by the data randomizer of the post-processor 130 on the mobile service data may be omitted. The data randomizer 211 may also discard the synchronization byte within the mobile service data packet and perform the randomizing process. This is an option that may be chosen by the system designer. In the example given in the present invention, the randomizing process is performed without discarding the synchronization byte within the mobile service data packet.

The RS frame encoder 212 gathers (or collects) a plurality of mobile service data packets being randomized and inputted, so as to create an RS frame payload. Then, the RS frame encoder 212 performs at least one of an error correction encoding process and an error detection encoding process in RS frame payload units, thereby configuring an RS frame. Accordingly, robustness may be provided to the mobile service data, thereby scattering group error that may occur during changes in a frequency environment, thereby enabling the enhanced data to respond to the frequency environment, which is extremely vulnerable and liable to frequent changes.

At this point, as an example of the present invention, in the RS frame encoder 212, RS-encoding is applied for the error correction encoding process, and a cyclic redundancy check (CRC) encoding is applied for the error detection process. When performing the RS-encoding, parity data that are used for the error correction are generated. And, when performing the CRC encoding, CRC data that are used for the error detection are generated.

The RS encoding is one of forward error correction (FEC) methods. The FEC corresponds to a technique for compensating errors that occur during the transmission process. The CRC data generated by CRC encoding may be used for indicating whether or not the mobile service data have been damaged by the errors while being transmitted through the channel. In the present invention, a variety of error detection coding methods other than the CRC encoding method may be used, or the error correction coding method may be used to enhance the overall error correction ability of the receiving system.

More specifically, the RS frame encoder 212 first divides the inputted mobile service data bytes to units of a predetermined length. Herein, the predetermined length is decided by the system designer. And, in the example of the present invention, the predetermined length is equal to 187 bytes, and, therefore, the 187-byte unit will be referred to as a packet for simplicity. For example, when the mobile service data that are being inputted correspond to a MPEG transport packet stream configured of 188-byte units, the first synchronization byte is removed, thereby configuring a 187-byte unit packet. Herein, the synchronization byte is removed because each mobile service data packet has the same value. Meanwhile, when the input data of the RS frame do not correspond to an MPEG TS packet format, the data may read in 187-byte units so as to configure the RS frame without having to perform the process of removing the MPEG synchronization byte.

More specifically, N number of packets configured of 187 bytes is grouped to configure a RS frame payload. At this point, the RS frame payload is configured as a RS frame payload having the size of N(row)*187(column) bytes, in which 187-byte packets are sequentially inputted in a row direction. At this point, the N number of columns within the N number of RS frame payload includes 187 bytes.

In this case, a (Nc,Kc)-RS encoding process is performed on each column, so as to generate Nc-Kc(=P) number of parity bytes. Then, the newly generated P number of parity bytes is added after the very last byte of the corresponding column, thereby creating a column of (187+P) bytes. Herein, Kc is equal to 187 (i.e., Kc=187), and Nc is equal to 187+P (i.e., Nc=187+P). For example, when P is equal to 48, (235, 187)-RS encoding process is performed so as to create a column of 235 bytes. When such RS encoding process is performed on all N number of columns, a RS frame having the size of N(row)*(187+P)(column) bytes may be created.

At this point, each row of the RS frame payload is configured of N bytes. However, depending upon channel conditions between the transmitting system and the receiving system, error may be included in the RS frame. When errors occur as described above, CRC data (or CRC code or CRC checksum) may be used on each row unit in order to verify whether error exists in each row unit. The RS frame encoder 212 may perform CRC encoding on the mobile service data being RS encoded so as to create (or generate) the CRC data. The CRC data being generated by CRC encoding may be used to indicate whether the mobile service data have been damaged while being transmitted through the channel. For example, when a 2-byte CRC checksum is added t each row, an RS frame having the size of (N+2) (row)*(187+P) (column) bytes may be created. The data of the RS frame configured on the RS frame encoder 212 are outputted to the turbo processor 213.

Figure 3:
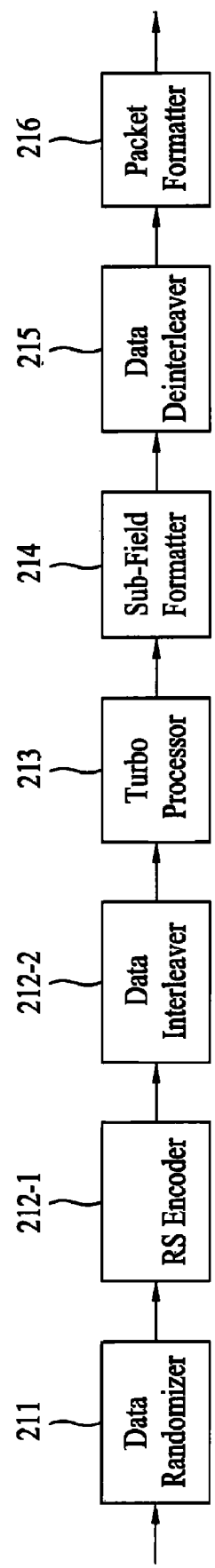
FIG. 3 illustrates a block diagram showing a structure of a pre-processor of the transmitting system shown in FIG. 1 according to another embodiment of the present invention.

According to another embodiment of the present invention, an RS encoder 212-1 and a data interleaver 212-2 may be placed between the data randomizer 211 and the turbo processor 213, as shown in FIG. 3, instead of the RS frame encoder 212. In this case, the process of gathering the randomized mobile service data packets so as to configure an RS frame is omitted. Instead, the RS encoder 212-1 performs RS encoding on each of the randomized mobile service data packet, thereby adding RS parity data to each packet. For example, 20 bytes of RS parity data may be added to each mobile service data packet. Furthermore, the mobile service data having the RS parity data added thereto is interleaved by the data interleaver 212-2 and then outputted to the turbo processor 213.

The turbo processor 213 encodes either the data being outputted from the RS frame encoder 212 or the data being outputted from the data interleaver 212-2 at a coding rate of 1/H. Then, the turbo processor 213 outputs the 1/H-rate encoded data to the sub-field formatter 214. More specifically, the turbo processor 213 divides the data being inputted in byte units into bit units. Then, one divided bits is encoded to H number of bits. Thereafter, the encoded bits are converted back to byte units and then outputted. For example, if 1 bit of the input data is coded to 2 bits and outputted, then H is equal to 2 (i.e., H=2). Alternatively, if 1 bit of the input data is coded to 4 bits and outputted, then H is equal to 4 (i.e., H=4). Hereinafter, the former coding rate will be referred to as a coding rate of 1/2 (1/2-rate coding), and the latter coding rate will be referred to as a coding rate of 1/4 (1/4-rate coding), for simplicity.

Turbo Processor

Figure 4:
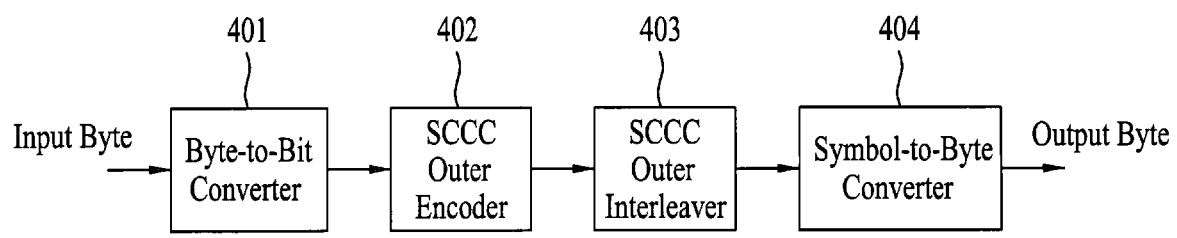
FIG. 4 illustrates a block diagram showing a structure of a turbo processor according to an embodiment of the present invention.

FIG. 4 illustrates a block diagram showing the structure of a turbo processor according to an embodiment of the present invention. Herein, the mobile service data are encoded by using a serial concatenation of convolutional codes (SCCC) method. The turbo processor of FIG. 4 includes a byte-bit converter 401, a serial concatenation of convolutional codes (SCCC) outer encoder 402, an SCCC outer interleaver 403, and a symbol-byte converter 404.

The byte-bit converter 401 divides the inputted data bytes to bits, which are then outputted to the SCCC outer encoder 402. The SCCC outer encoder 402 corresponds to a 1/H encoder encoding and outputting 1 bit of the inputted data to H bits. At this point, the SCCC outer encoder (or outer convolutional encoder) 402 is (virtually) in serial concatenation with the trellis encoder of the post-processor through the SCCC outer (symbol) interleaver, so as to form a serial turbo code. In the transmitting system, multiple blocks actually exist between the trellis encoding unit of the post-processor. However, in the receiving system, two blocks are considered to be in concatenation, thereby being decoded accordingly.

Figure 5:
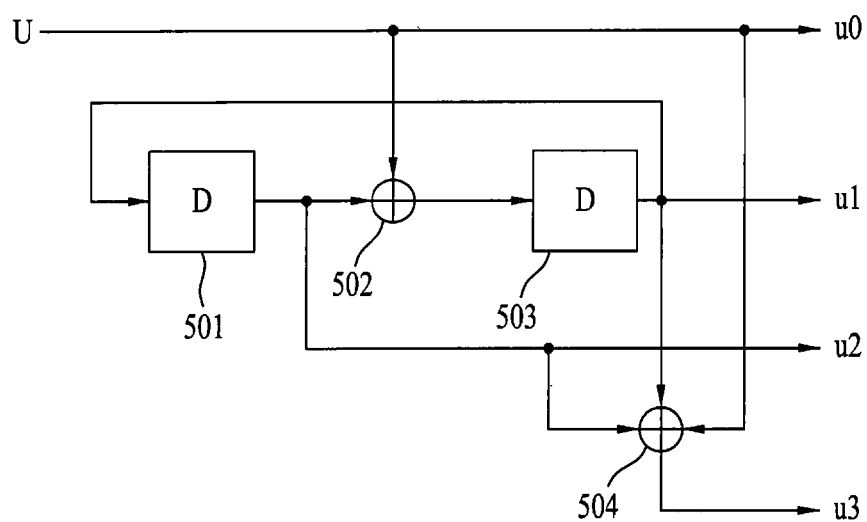
FIG. 5 illustrates a detailed block diagram showing a structure of an SCCC outer encoder shown in FIG. 4 according to an embodiment of the present invention.

FIG. 5 illustrates a detailed block diagram of the SCCC outer encoder 402. The SCCC outer encoder 402 includes two delay units 501 and 503 and two adders 502 and 504. Herein, the SCCC outer encoder 402 encodes an input data bit U and outputs the coded bit U to 4 bits (u0 to u3). At this point, the input data bit U is directly outputted as uppermost bit u0 and simultaneously encoded as lower bit u1u2u3 and then outputted. More specifically, the input data bit U is directly outputted as the uppermost bit u0 and simultaneously outputted to the first and two adders 502 and 504.

The first adder 502 adds the input data bit U and the output bit of the first delay unit 501 and, then, outputs the added bit to the second delay unit 503. Then, the data bit delayed by a pre-determined time (e.g., by 1 clock) in the second delay unit 503 is fed-back to the first delay unit 501 and the second adder 504 and simultaneously outputted as a lower bit u1. The first delay unit 501 delays the data bit fed-back from the second delay unit 503 by a pre-determined time (e.g., by 1 clock). Then, the first delay unit 501 outputs the delayed data to the first adder 502 and the second adder 504 and, at the same time, outputs the delayed data bit as a lower bit u2. The second adder 504 adds all of the input data bit U and the data bits outputted from the first and second delay units 501 and 503 and outputs the added data bits as a lower bit u3.

At this point, when the data bit U inputted to the SCCC outer encoder 402 shown in FIG. 5 corresponds to data that are to be encoded at a coding rate of 1/2, a symbol may be configured of bits u0u1 of the four output bits u0u1u2u3, thereby being outputted. Alternatively, when the data bit U corresponds to data that are to be encoded at a coding rate of 1/4, a symbol configured of bits u0u1 and another symbol configured of bits u2u3 may be outputted through a serial/parallel converter. According to another embodiment of the present invention, when the data bit U corresponds to data that are to be 1/4-rate encoded, a symbol configured of bits u0u1 may be repeated twice and then outputted.

According to yet another embodiment of the present invention, the SCCC outer encoder 402 outputs all four output bits u0u1u2u3. And, in a later process, when the coding rate is 1/2, the SCCC outer interleaver 403 may be designed to select only a symbol configured of bits u0u1 of the four output bits u0u1u2u3. Alternatively, when the coding rate is 1/4, the SCCC outer interleaver 403 may be designed to select a symbol configured of bits u0u1 and another symbol configured of bits u2u3. According to yet another embodiment of the present invention, when the coding rate is 1/4, the SCCC outer interleaver 403 may be designed to repeatedly select a symbol configured of bits u0u1 twice.

The output of the SCCC outer encoder 402 is inputted to the SCCC outer interleaver 403. And, the SCCC outer interleaver 403 performs block-interleaving on the data outputted from the SCCC outer encoder 402 in symbol units. Any interleaver that can structurally perform order rearrangement (or realignment) may be applied as the SCCC outer interleaver 403. However, the SCCC outer interleaver 403 according to the embodiment of the present invention corresponds to a variable length interleaver that may be applied even when a plurality of lengths is provided for the symbol, so that its order may be rearranged.

Equation 1 shown below describes the process of sequentially receiving BK number of symbols, the order of which is to be rearranged by the SCCC outer encoder 402, and obtaining an BL value satisfying the conditions of $BL=2^n$ (wherein n is an integer) and of $BL \geq BK$, thereby creating the interleaving pattern so as to realign (or rearrange) the symbol order.

Equation 1

In relation to all places, wherein $0 \leq i \leq BL-1$, $$P(i) = 89 \times i \times (i+1)/2 \bmod BL$$

Herein, $BL \geq BK$, $BL=2^n$, wherein n is an integer.

More specifically, BK indicates a number of symbols that are outputted for symbol interleaving from the SCCC outer interleaver 402. And, BL represents a number of symbols that are actually interleaved by the SCCC outer interleaver (or symbol interleaver) 403. In the present invention, the SCCC outer interleaver 403 should satisfy the conditions of $BL=2^n$ (wherein n is an integer) and of $BL \geq BK$. If there is a difference in value between BK and BL, (BL−BK) number of null (or dummy) symbols is added, thereby creating an interleaving pattern. Therefore, BK becomes a block size of the actual symbols that are inputted to the SCCC outer interleaver 403 in order to be interleaved. BL becomes an interleaving unit when the interleaving process is performed based upon an interleaving pattern created from the SCCC outer interleaver 403.

As shown in Equation 1, the order of BK number of input symbols and (BL−BK) number of null symbols is rearranged in BL symbol units. Then, as shown in Equation 2 below, the null byte places are removed, so as to rearrange the order. Thereafter, the symbol that is interleaved by the rearranged order is then outputted to the symbol-byte converter 404.

if $P(i) \geq BK$, Equation 2 then null symbol place is removed from P(i) and rearranged

Subsequently, the symbol-byte converter 404 converts to bytes the mobile service data symbols, having the rearranging of the symbol order completed by the SCCC outer interleaver 403 and then outputted in accordance with the rearranged order. Thereafter, the symbol-byte converter 404 outputs the converted bytes to the sub-field formatter 304.

Figure 6:
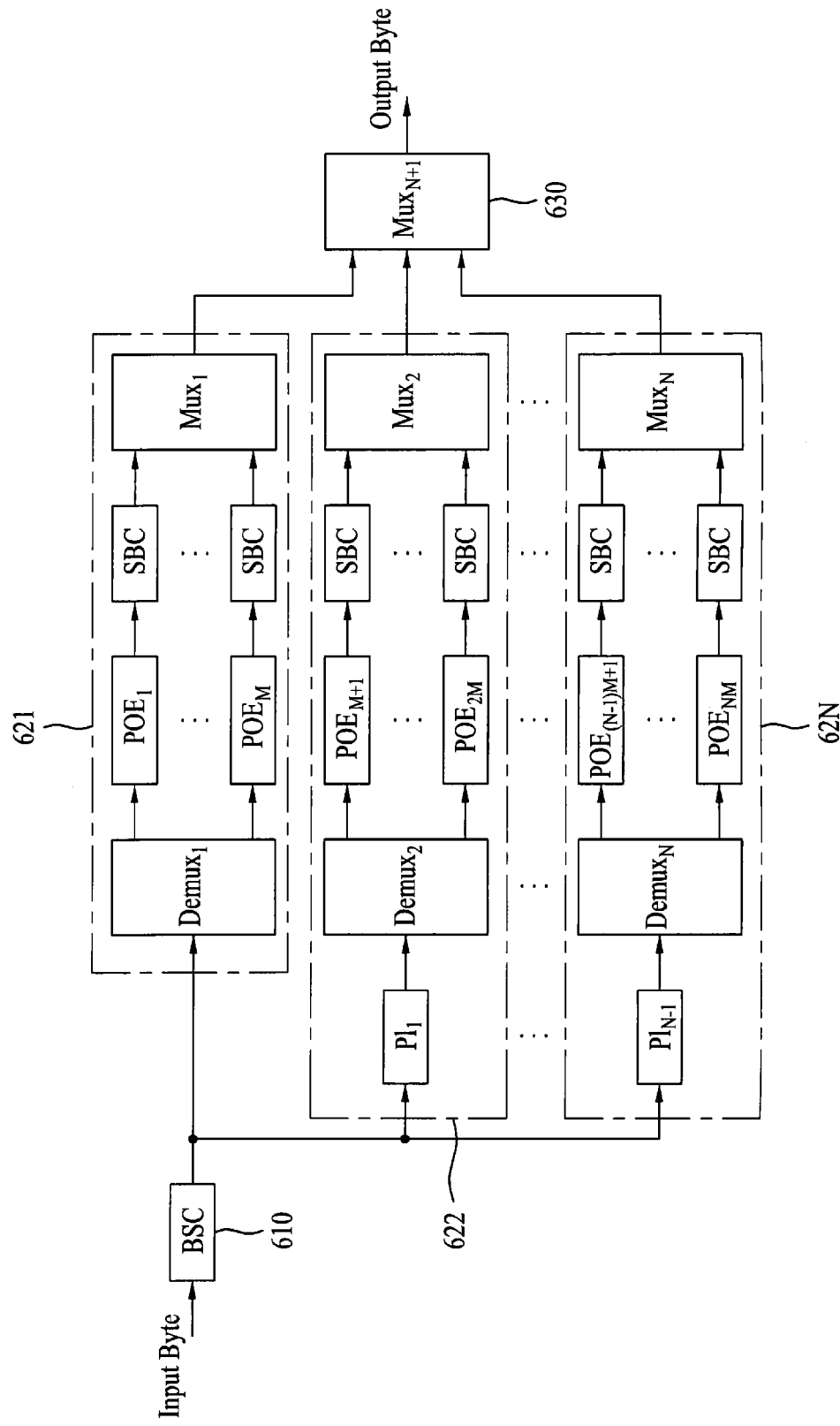
FIG. 6 illustrates a block diagram showing a structure of a turbo processor according to another embodiment of the present invention.

FIG. 6 illustrates a block diagram showing the structure of a turbo processor according to an embodiment of the present invention. Herein, the mobile service data are encoded by using a parallel concatenation of convolutional codes (PCCC) method.

The turbo processor of FIG. 6 includes a byte-symbol converter 610, N number of 1/H1 encoders 621 to 62N, and a (N×1) multiplexer 630 multiplexing and outputting the output of the N number of 1/H1 encoders 621 to 62N. Herein, H1 is an integer. The byte-symbol converter 610 divides the outputted data bytes to symbols, thereby simultaneously outputting the divided symbols to N number of 1/H1 encoders 621 to 62N.

Among the N number of 1/H1 encoders 621 to 62N, the first 1/H1 encoder 621 includes a demultiplexer, M number of PCCC outer encoders formed in parallel, M number of symbol-byte converters connected to each of the M number of PCCC outer encoders, and an (M×1) multiplexing and outputting the output of the M number of symbol-byte converters. With the exception of the first 1/H1 encoder 621, each of the remaining 1/H1 encoders 622 to 62N further includes a PCCC interleaver before the demultiplexer. At this point, the (N−1) number of PCCC interleavers may each be configured in different structures.

Therefore, among the N number of 1/H1 encoders 621 to 62N, the demultiplexer of the first 1/H1 encoder 621 outputs the symbol being outputted from the byte-symbol converter 610 to any one of the M number of PCCC outer encoders. The PCCC interleaver of each of the remaining 1/H1 encoders 622 to 62N, excluding the first 1/H1 encoder 621, interleaves the input symbol and then outputs the interleaved symbol to the demultiplexer. Subsequently, the demultiplexer outputs the interleaved symbol to any one of the M number of PCCC outer encoders. The PCCC outer encoder corresponds to a 1/H2 encoder, which encodes and outputs 1 bit of the inputted data to H2 bits. Herein, H2 is also an integer.

The overall coding rate 1/H of the turbo encoder shown in FIG. 6 varies depending upon the number of 1/H1 encoders and the coding rate of the PCCC outer encoder. For example, when the number of 1/H1 encoders is equal to '2' (i.e., a $1^{st}$ 1/H1 encoder 621 and a $2^{nd}$ 1/H1 encoder 622), and when the coding rate of the PCCC outer encoder is 1/2, the overall coding rate of the turbo encoder becomes 1/4. In another example, when the number of 1/H1 encoders is equal to '2' (i.e., a $1^{st}$ 1/H1 encoder 621 and a $2^{nd}$ 1/H1 encoder 622), and when the coding rate of the PCCC outer encoder is 1, the overall coding rate of the turbo encoder becomes 1/2.

Furthermore, the total number of PCCC outer encoders is limited to '12'. More specifically, the value of N×M shall be equal to '12'.

For example, when the number (N) of 1/H1 encoders is equal to '12', only one PCCC outer encoder is provided to each 1/H1 encoder. In this case, the demultiplexer and the (M×1) multiplexer are omitted, or the inputted data bypass the demultiplexer and the (M×1) multiplexer. In another example, when the number (N) of 1/H1 encoders is equal to '4', three PCCC outer encoders are provided to each 1/H1 encoder. In yet another example, when the number (N) of 1/H1 encoders is equal to '1', only the first 1/H1 encoder operates, and 12 PCCC outer encoders are provided to the first 1/H1 encoder.

Furthermore, the coding rate of each PCCC outer encoder within the 1/H1 encoder should be identical to one another. For example, when it is assumed that three PCCC outer encoders are provided in the first 1/H1 encoder, each of the three PCCC outer encoders should have the same coding rate. For example, when the coding rate is 1/2, the three PCCC outer encoders should equally perform 1/2-rate coding processes.

At this point, the PCCC outer encoders do not require to be formed in the same structure. More specifically, each of the PCCC outer encoders may have the same structure or may each have a different structure. In other words, regardless of the structure of each PCCC outer encoder, the coding rate of the PCCC outer encoders should be the same.

At this point, the PCCC outer encoder (or outer convolutional encoder) is (virtually) in parallel concatenation with the trellis encoder of the post-processor, so as to form a parallel turbo code. In the transmitting system, multiple blocks actually exist between the trellis encoding unit of the post-processor 130. However, in the receiving system, two blocks are considered to be in concatenation, thereby being decoded accordingly.

Therefore, the output byte of each PCCC outer encoder is provided to each of the 12 trellis encoders within the trellis encoding module included in the post-processor. For example, the output bytes may be aligned so that the output byte of the $12^{th}$ PCCC outer encoder is inputted to the $12^{th}$ trellis encoder of the trellis encoding module. More specifically, each of the PCCC outer encoders may be paired with a specific trellis encoder among the 12 trellis encoders included in the trellis encoding module.

Furthermore, the demultiplexer within each 1/H1 encoder, N number of (M×1) multiplexers, and one (N×1) multiplexer maps the output byte of each PCCC outer encoder to each respective trellis encoder of the trellis encoding module within the post-processor.

Figure 7:
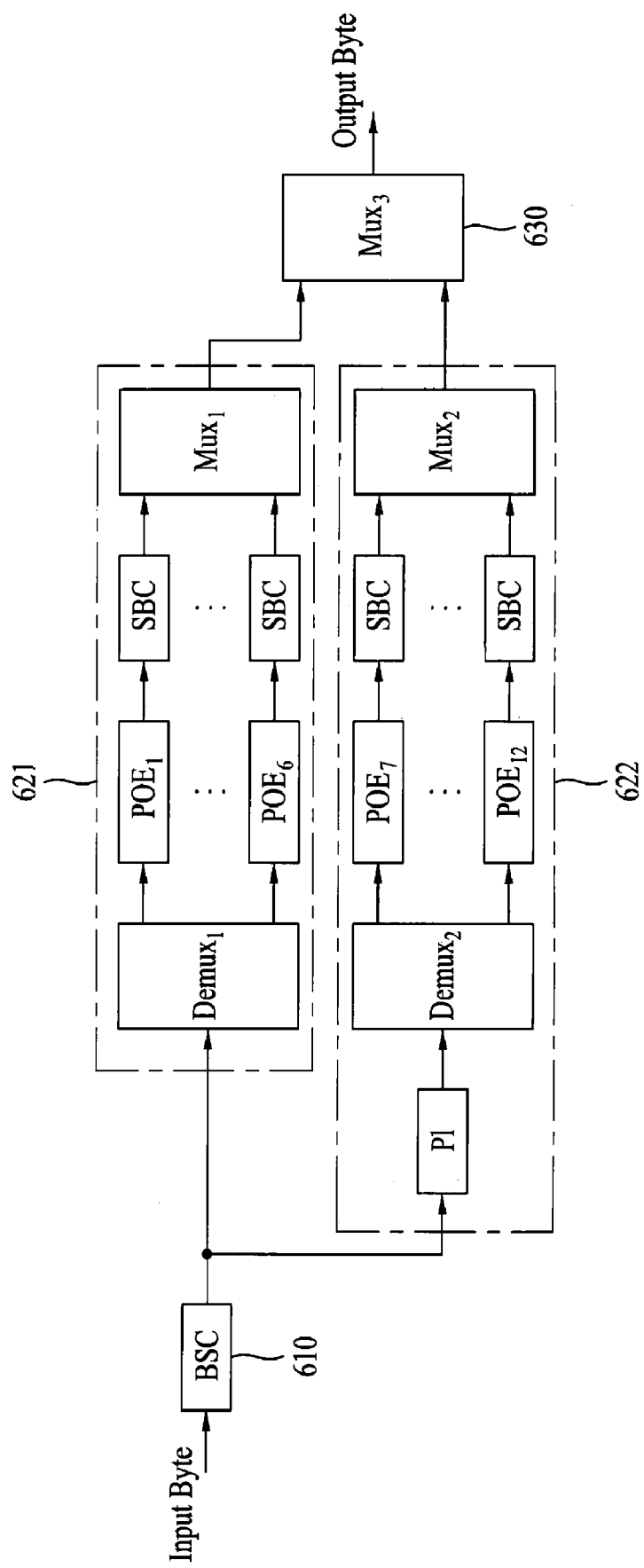
FIG. 7 illustrates a block diagram showing a structure of a turbo processor according to yet another embodiment of the present invention.

FIG. 7 illustrates a block diagram showing a detailed structure of the PCCC type turbo processor shown in FIG. 6 according to an embodiment of the present invention. More specifically, FIG. 7 shows an example of the number of 1/H1 encoders being equal to '2' and 6 PCCC outer encoders being included in each 1/H1 encoder. In other words, FIG. 7 shows an example of the PCCC type turbo processor according to an embodiment of the present invention, when N=2 and M=6.

Referring to FIG. 7, the demultiplexer of the first 1/H1 encoder 621 outputs the symbol data being outputted from the byte-symbol converter 610 to one of the 6 PCCC outer encoders. The corresponding PCCC outer encoder receiving the symbol data through the demultiplexer encodes the received symbol data at a predetermined coding rate, thereby outputting the encoded symbol data to the symbol-byte converter. The symbol-byte converter converts the symbol data encoded by the PCCC outer encoder to byte units, thereby outputting the converted data bytes to the multiplexer. Herein, the multiplexer corresponds to a (6×1) multiplexer, which selects the output of one of the 6 PCCC outer encoders, thereby outputting the selected output to the multiplexer 630.

The PCCC interleaver of the second 1/H1 encoder 622 interleaves the symbol-unit data being outputted from the byte-symbol converter 610 and outputs the interleaved symbol-unit data to the demultiplexer. Then, the demultiplexer outputs the interleaved symbol data to one of the 6 PCCC outer encoders. The corresponding PCCC outer encoder receives the interleaved symbol data from the demultiplexer and encodes the received data at a predetermined coding rate, thereby outputting the encoded data to the symbol-byte converter. The symbol-byte converter converts the symbol data encoded by the PCCC outer encoder to byte units, thereby outputting the converted byte-unit data to the multiplexer. Herein, the multiplexer corresponds to a (6×1) multiplexer, which selects the output of one of the 6 PCCC outer encoders, thereby outputting the selected output to the multiplexer 630.

The multiplexer 630 corresponds to a (2×1) multiplexer, which selects the output from one of the multiplexer included in the first 1/H1 encoder and the multiplexer included in the second 1/H1 encoder, thereby outputting the selected output to the sub-field formatter 214. For example, when the coding rate of each of the 6 PCCC outer encoders is 1, the overall coding rate of the turbo processor shown in FIG. 7 becomes 1/2. Alternatively, when the coding rate of each of the 6 PCCC outer encoders is 1/2, the overall coding rate of the turbo processor shown in FIG. 7 becomes 1/4. More specifically, the overall coding rate of the turbo processor is equal to (the coding rate of each PCCC outer encoder)×(1/N). Herein, N is equal to the number of 1/H1 encoders.

Figure 8:
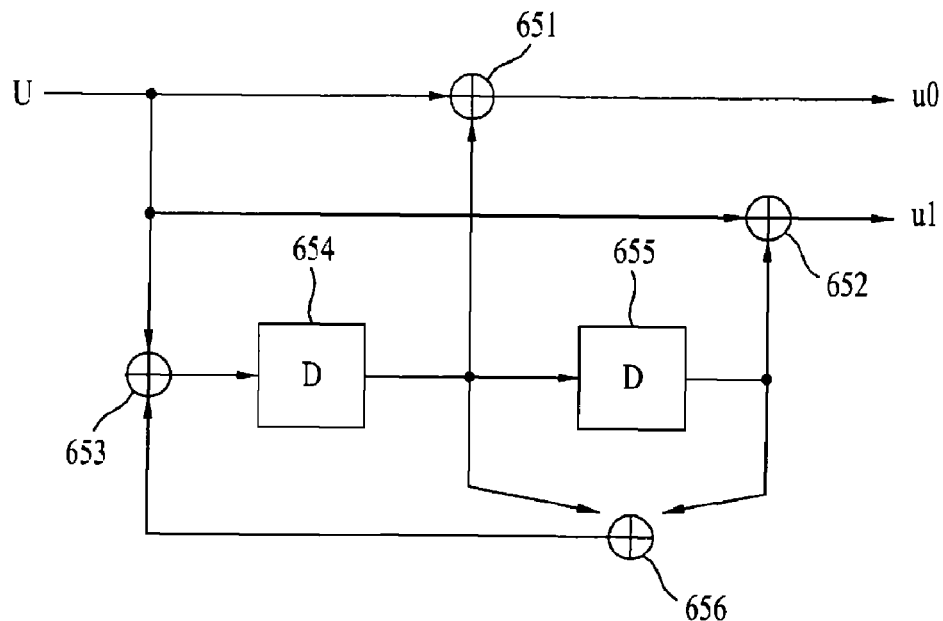
FIG. 8 illustrates a detailed block diagram showing a structure of a PCCC outer encoder shown in FIG. 7 according to an embodiment of the present invention.
Figure 9:
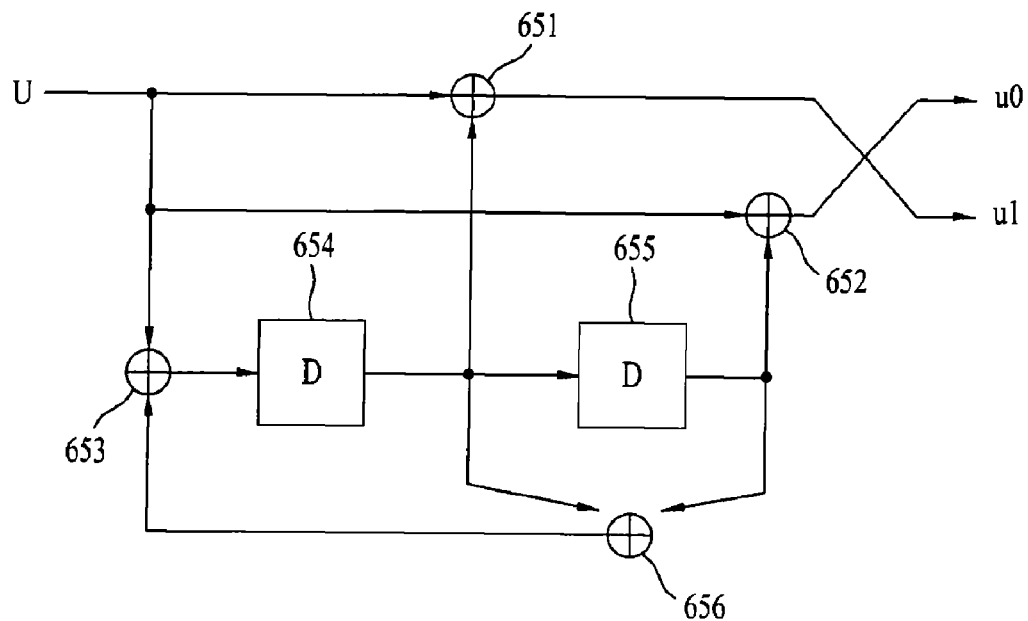
FIG. 9 illustrates a detailed block diagram showing a structure of a PCCC outer encoder shown in FIG. 7 according to another embodiment of the present invention.

FIG. 8 and FIG. 9 respectively illustrate detailed block diagrams of the PCCC outer encoder. More specifically, the structure of each PCCC outer encoder within the turbo processor may not be identical to one another. More specifically, each of the PCCC outer encoders may have the same structure or may each have a different structure. In other words, regardless of the structure of each PCCC outer encoder, the coding rate of the PCCC outer encoders should be the same.

The PCCC outer encoder of FIG. 8 consists of two delay units 654 and 655 and four adders 651 to 653 and 656. Herein, the PCCC outer encoder of FIG. 8 encodes the input data bit U and outputs the encoded data bit as two bits u0 and u1.

More specifically, the input data bit U is outputted to the first adder 651 to the third adder 653. And, the first adder 651 adds the input data bit U and the output of the first delay unit 654, thereby outputting the added result as an upper bit u0. Thereafter, the second adder 652 adds the input data bit U and the output of the second delay unit 655, thereby outputting the added result as a lower bit u1. The third adder 653 adds the input data bit U and the output of the fourth adder 656, thereby outputting the added result to the first delay unit 654.

Subsequently, the data delayed by a pre-determined time (e.g., by 1 clock) in the first delay unit 654 are outputted to the first and fourth adders 651 and 656 and to the second delay unit 655. The data delayed by a pre-determined time (e.g., by 1 clock) in the second delay unit 655 are outputted to the second and fourth adders 652 and 656. And, the fourth adder 656 adds the output of the first and second delay units 654 and 655, thereby outputting the added result to the third adder 653. With the exception of the output of the second adder 652 becoming an upper bit u0 and the output of the first adder 651 becoming a lower bit u1, the structure and operations of the PCCC outer encoder shown in FIG. 9 identical to those of the PCCC outer encoder shown in FIG. 8. Therefore, a detailed description of the same will be omitted for simplicity.

Figure 10:
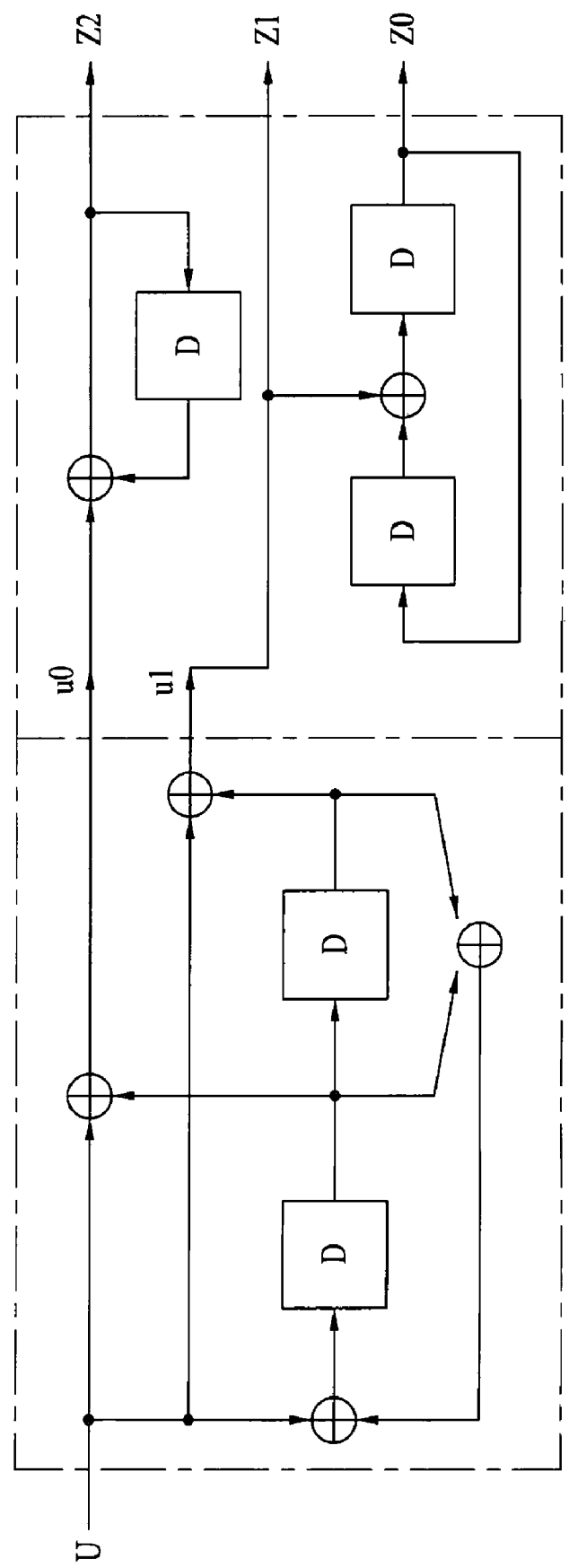
FIG. 10 illustrates an example of the PCCC outer encoder shown in FIG. 7 being concatenated with a trellis encoder according to an embodiment of the present invention.

FIG. 10 illustrates an example of the PCCC outer encoder of FIG. 8 serially concatenated with a trellis encoder. Multiple blocks actually exist between the PCCC outer encoder and the trellis encoder. However, in the receiving system, two blocks are considered to be in concatenation, thereby being decoded accordingly. More specifically, the trellis encoder pre-codes an upper bit u0 being outputted from the PCCC outer encoder of FIG. 8, so as to output a most significant output bit Z2. Also, the trellis encoder trellis-encodes a lower bit u1 being outputted from the PCCC outer encoder of FIG. 8, so as to output two output bits Z1 and Z0.

Figure 11:
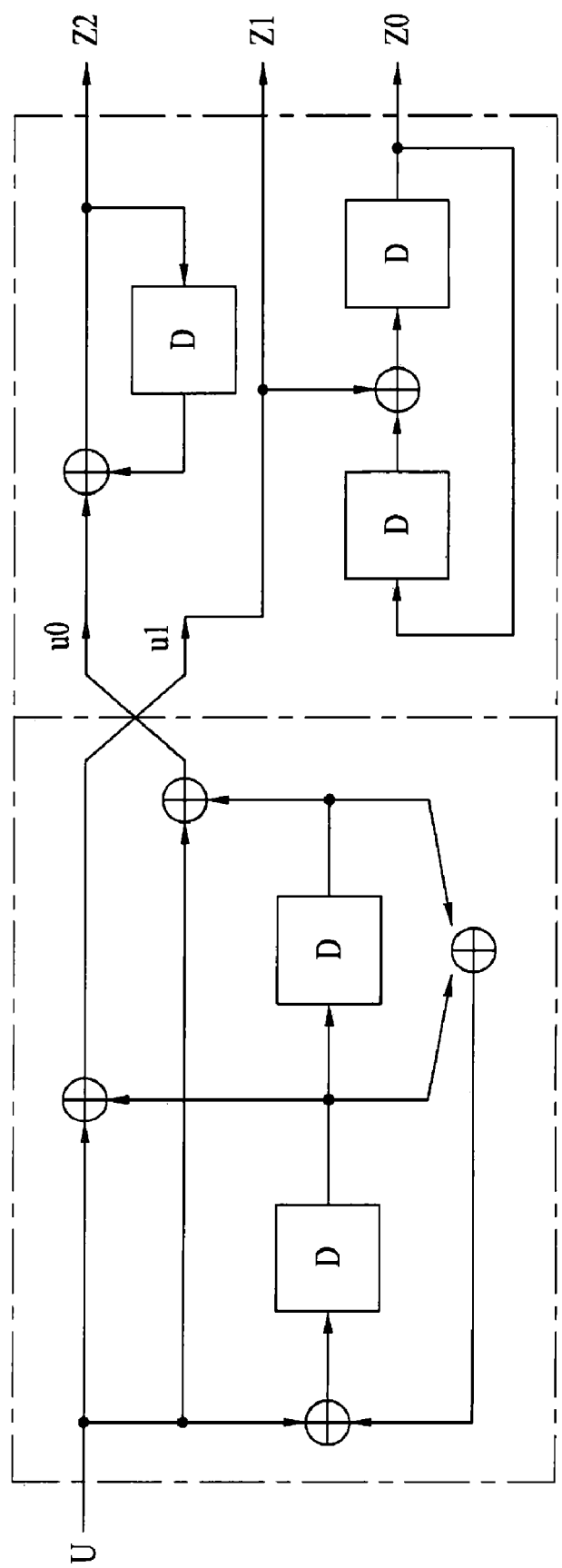
FIG. 11 illustrates an example of the PCCC outer encdoer shown in FIG. 8 being concatenated with a trellis encoder according to an embodiment of the present invention.

FIG. 11 illustrates an example of the PCCC outer encoder of FIG. 9 serially concatenated with a trellis encoder. Multiple blocks actually exist between the PCCC outer encoder and the trellis encoder. However, in the receiving system, two blocks are considered to be in concatenation, thereby being decoded accordingly. Similarly, the trellis encoder pre-codes an upper bit u0 being outputted from the PCCC outer encoder of FIG. 9, so as to output a most significant output bit Z2. Also, the trellis encoder trellis-encodes a lower bit u1 being outputted from the PCCC outer encoder of FIG. 9, so as to output two output bits Z1 and Z0. In the present invention, the PCCC outer encoder and the symbol-byte converter connected to the PCCC outer encoder will be collectively referred to as an effective component encoder.

Figure 12:
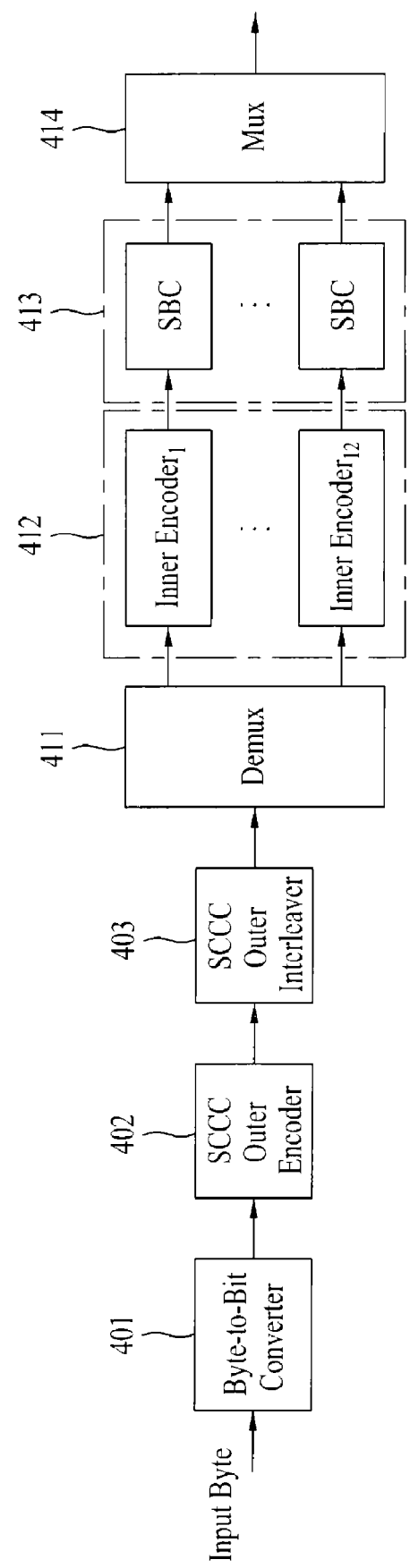
FIG. 12 illustrates a block diagram showing a structure of a turbo processor according to yet another embodiment of the present invention.

FIG. 12 illustrates a block diagram showing the structure of a turbo processor according to an embodiment of the present invention. FIG. 12 shows an example wherein 12 inner encoders are added to the SCCC type encoder. More specifically, the turbo processor of FIG. 12 includes a byte-bit converter 401, a serial concatenation of convolutional codes (SCCC) outer encoder 402, an SCCC outer interleaver 403, a demultiplexer 411, 12 inner encoders 412 formed in parallel, 12 symbol-byte converters 413 formed in parallel, and a multiplexer 414. The byte-bit converter 401 divides the inputted data bytes to bits, which are then outputted to the SCCC outer encoder 402. The SCCC outer encoder 402 corresponds to a 1/H3 encoder encoding and outputting 1 bit of the inputted data to H3 bits. Herein, H3 is an integer.

The output of the SCCC outer encoder 402 is inputted to the SCCC outer interleaver 403. And, the SCCC outer interleaver 403 performs block-interleaving on the data outputted from the SCCC outer encoder 402 in symbol units. Any interleaver that can structurally perform order rearrangement (or realignment) may be applied as the SCCC outer interleaver 403. However, the SCCC outer interleaver 403 according to the embodiment of the present invention corresponds to a variable length interleaver that may be applied even when a plurality of lengths is provided for the symbol, so that its order may be rearranged. The operations of the SCCC symbol interleaver 403 are identical to those described in the SCCC outer interleaver 403 of FIG. 4 and Equation 1 and Equation 2. Therefore, detailed description of the same will be omitted for simplicity.

The output of the outer interleaver 403 is inputted to the demultiplexer 411, and the demultiplexer 411 outputs the interleaved data to one of the 12 inner encoders.

The inner encoder receiving the data from the demultiplexer 411 encodes the inputted data at a predetermined coding rate. Then, the corresponding inner encoder outputs the encoded input data to a respective symbol-byte converter. The symbol-byte converter converts the symbol data encoded from the corresponding inner encoder to byte units, thereby outputting the converted byte-unit data to the multiplexer 414. The multiplexer 414 corresponds to a (12×1) multiplexer, which selects the output of one of the 12 symbol-byte converters, thereby outputting the selected output to the sub-field formatter 214.

For example, when the coding rate of the SCCC outer encoder 402 is 1/2, and when the coding rate of each of the 12 inner encoders is 1/2, the overall coding rate of the turbo processor shown in FIG. 12 is 1/4. Alternatively, when the coding rate of the SCCC outer encoder 402 is 1, and when the coding rate of each of the 12 inner encoders is 1/2, the overall coding rate of the turbo processor shown in FIG. 12 is 1/2. Conversely, when the coding rate of the SCCC outer encoder 402 is 1/2, and when the coding rate of each of the 12 inner encoders is 1, the overall coding rate of the turbo processor shown in FIG. 12 is also 1/2. Herein, the overall coding rate of the turbo processor shown in FIG. 12 is equal to (the coding rate of the SCCC outer encoder)×(the coding rate of the inner encoder).

Referring to FIG. 12, the 12 inner encoder 412 are respectively connected to (or concatenated with) 12 trellis encoders of the trellis encoding module included in the post-processor 130, so as to be in a one-to-one (1:1) correspondence.

More specifically, each of the inner encoder is paired with a specific trellis encoder among the 12 trellis encoders of the trellis encoding module. Herein, multiple blocks actually exist between the inner encoder and the trellis encoder. However, in the receiving system, two blocks are considered to be in concatenation, thereby being decoded accordingly.

Figure 13:
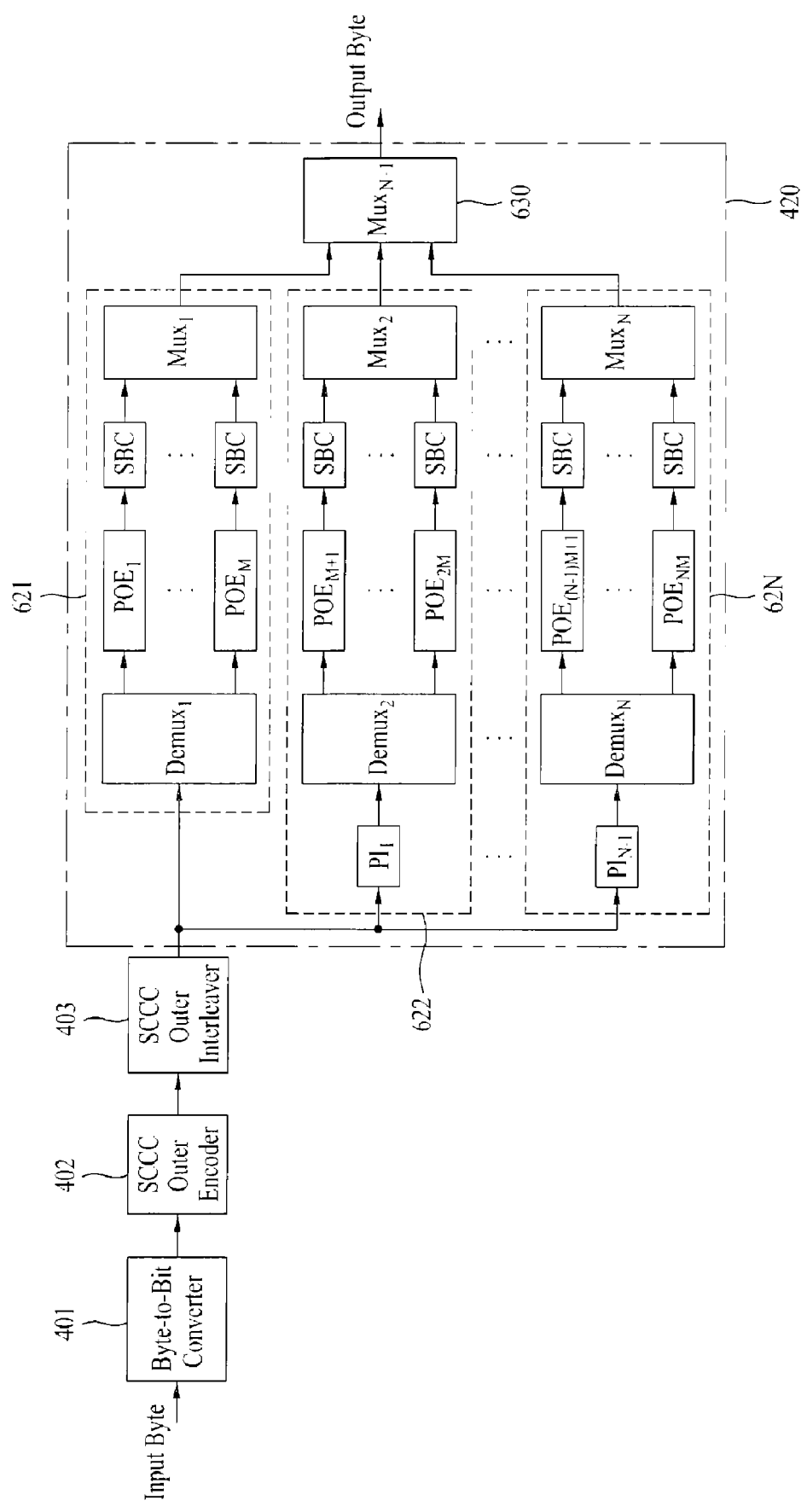
FIG. 13 illustrates a block diagram showing a structure of a turbo processor according to yet another embodiment of the present invention.

FIG. 13 illustrates a block diagram showing the structure of a turbo processor according to an embodiment of the present invention. FIG. 13 shows an example wherein the PCCC encoder shown in FIG. 6 is added to the SCCC type encoder. Hereinafter, this structure will be referred to as hybrid turbo encoder for simplicity.

More specifically, the turbo processor of FIG. 13 includes a byte-bit converter 401, a serial concatenation of convolutional codes (SCCC) outer encoder 402, an SCCC outer interleaver 403, and a PCCC encoder 420. The byte-bit converter 401 divides the inputted data bytes to bits, which are then outputted to the SCCC outer encoder 402. The SCCC outer encoder 402 corresponds to a 1/H3 encoder encoding and outputting 1 bit of the inputted data to H3 bits. Herein, H3 is an integer.

The output of the SCCC outer encoder 402 is inputted to the SCCC outer interleaver 403. And, the SCCC outer interleaver 403 performs block-interleaving on the data outputted from the SCCC outer encoder 402 in symbol units. Any interleaver that can structurally perform order rearrangement (or realignment) may be applied as the SCCC outer interleaver 403. However, the SCCC outer interleaver 403 according to the embodiment of the present invention corresponds to a variable length interleaver that may be applied even when a plurality of lengths is provided for the symbol, so that its order may be rearranged. The operations of the SCCC symbol interleaver 403 are identical to those described in the SCCC outer interleaver 403 of FIG. 4 and Equation 1 and Equation 2. Therefore, detailed description of the same will be omitted for simplicity.

The output of the SCCC outer interleaver 403 is inputted to the PCCC encoder 420.

As shown in FIG. 6, the PCCC encoder includes N number of 1/H1 encoders 621 to 62N, and a (N×1) multiplexer 630 multiplexing and outputting the output of the N number of 1/H1 encoders 621 to 62N. Herein, Hi is an integer. Therefore, since the structure and operations of the PCCC encoder is similar to those of the PCCC encoder shown in FIG. 6, detailed description of the same will be omitted for simplicity.

Similarly, the overall coding rate 1/H of the turbo encoder shown in FIG. 13 varies depending upon the number of 1/H1 encoders and the coding rates of the SCCC outer encoder 402 and the PCCC encoder 420. The coding rate of the PCCC encoder 420 may vary depending upon the number of 1/H1 encoders within the PCCC encoder 420 and the coding rate of the PCCC outer encoder. For example, when the coding rate of the SCCC outer encoder 402 is 1/2, and when the coding rate of the PCCC encoder 420 is 1/2, the overall coding rate of the turbo processor is 1/4.

Furthermore, the total number of PCCC outer encoders within PCCC encoder 420 is limited to '12'. More specifically, the value of N×M shall be equal to '12'. For example, when the number (N) of 1/H1 encoders is equal to '12', only one PCCC outer encoder is provided to each 1/H1 encoder. In this case, the demultiplexer and the (M×1) multiplexer are omitted, or the inputted data bypass the demultiplexer and the (M×1) multiplexer.

In another example, when the number (N) of 1/H1 encoders is equal to '4', three PCCC outer encoders are provided to each 1/H1 encoder. In yet another example, when the number (N) of 1/H1 encoders is equal to '1', only the first 1/H1 encoder operates, and 12 PCCC outer encoders are provided to the first 1/H1 encoder.

Furthermore, the coding rate of each PCCC outer encoder within the 1/H1 encoder should be identical to one another. For example, when it is assumed that three PCCC outer encoders are provided in the first 1/H1 encoder, each of the three PCCC outer encoders should have the same coding rate. For example, when the coding rate is 1/2, the three PCCC outer encoders should equally perform 1/2-rate coding processes.

At this point, the PCCC outer encoders do not require to be formed in the same structure. More specifically, each of the PCCC outer encoders may have the same structure or may each have a different structure. In other words, regardless of the structure of each PCCC outer encoder, the coding rate of the PCCC outer encoders should be the same. At this point, the PCCC outer encoder (or outer convolutional encoder) is (virtually) in parallel concatenation with the trellis encoder of the post-processor, so as to form a parallel turbo code. In the transmitting system, multiple blocks actually exist between the trellis encoding unit of the post-processor 130. However, in the receiving system, two blocks are considered to be in concatenation, thereby being decoded accordingly.

Therefore, the output byte of each PCCC outer encoder is provided to each of the 12 trellis encoders within the trellis encoding module included in the post-processor. For example, the output bytes may be aligned so that the output byte of the $12^{th}$ PCCC outer encoder is inputted to the $12^{th}$ trellis encoder of the trellis encoding module. More specifically, each of the PCCC outer encoders may be paired with a specific trellis encoder among the 12 trellis encoders included in the trellis encoding module. Furthermore, the demultiplexer within each 1/H1 encoder, N number of (M×1) multiplexers, and one (N×1) multiplexer maps the output byte of each PCCC outer encoder to each respective trellis encoder of the trellis encoding module within the post-processor.

Meanwhile, the data turbo-encoded at a rate of 1/H by any one of the turbo processor shown in FIG. 4 to FIG. 13 are outputted to the sub-field formatter 214.

The sub-field formatter 214 gathers turbo-encoded data, known data (or training data) place holders, TCM initialization place holders for initializing a trellis encoding module (TCM), signaling data place holders, MPEG header place holders, RS parity place holders, and main service data place holders so as to configure a sub-field. Herein, the known data (or training data) place holders, the TCM initialization place holders, the signaling data place holders, the MPEG header place holders, the RS parity place holders, and the main service data place holders are required for data deinterleaving in a later process. For example, the main service data place holders are inserted because, based upon the data prior to deinterleaving (i.e., the data after interleaving), main service data may be mixed in-between the mobile service data. Furthermore, according to an embodiment of the present invention, based upon the data after data deinterleaving (i.e., the data prior to interleaving), the place holders for the MPEG data are allocated at the very beginning of each packet. At this point, according to the embodiment of the present invention assigns 3 bytes to the MPEG header place position.

Figure 16:
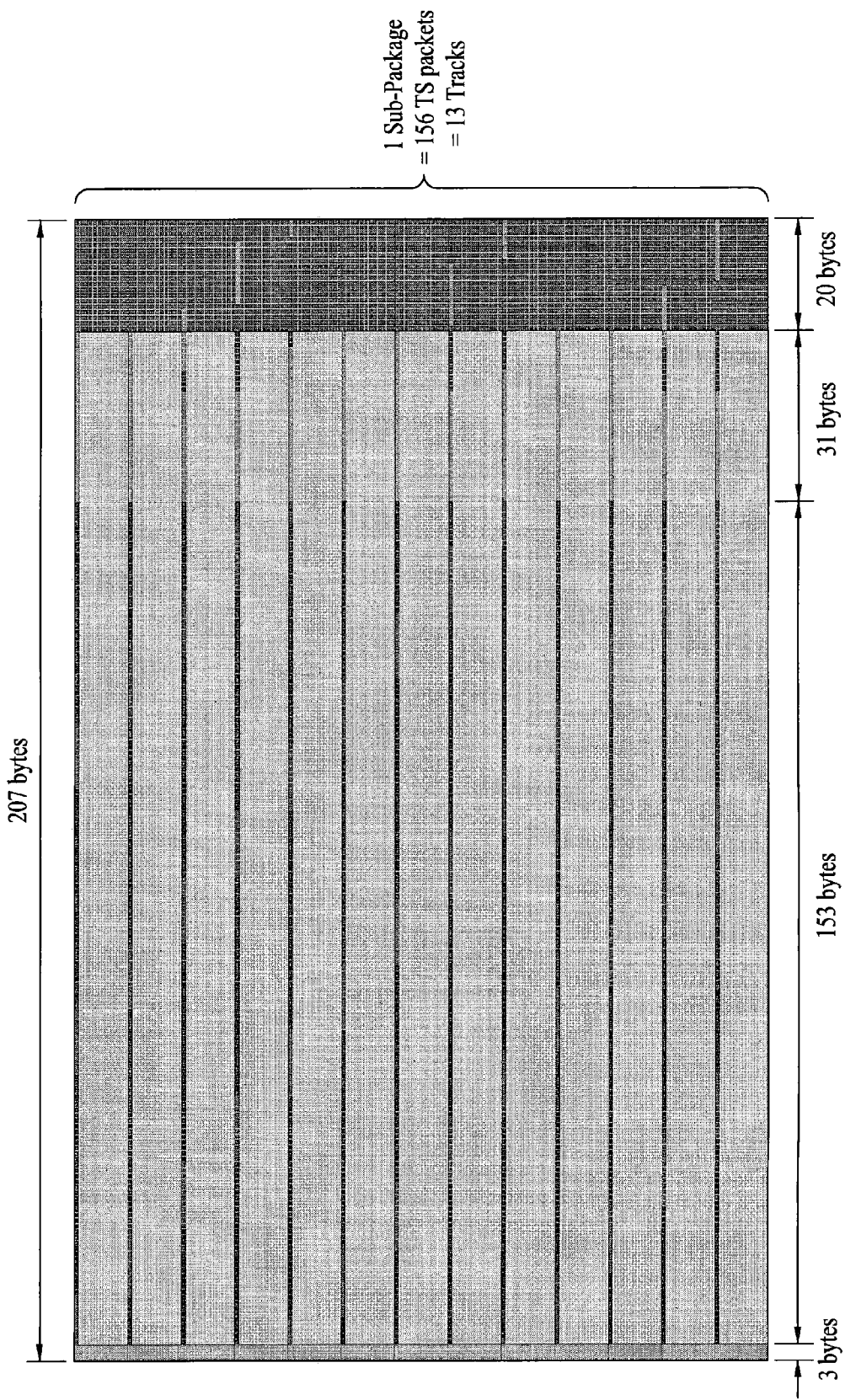
FIG. 16 illustrates an exemplary data structure of a sub-package having an M/H service data packet allocated thereto, after data deinterleaving, wherein the M/H service data packet includes known data in the first data packet of each track.
Figure 17:
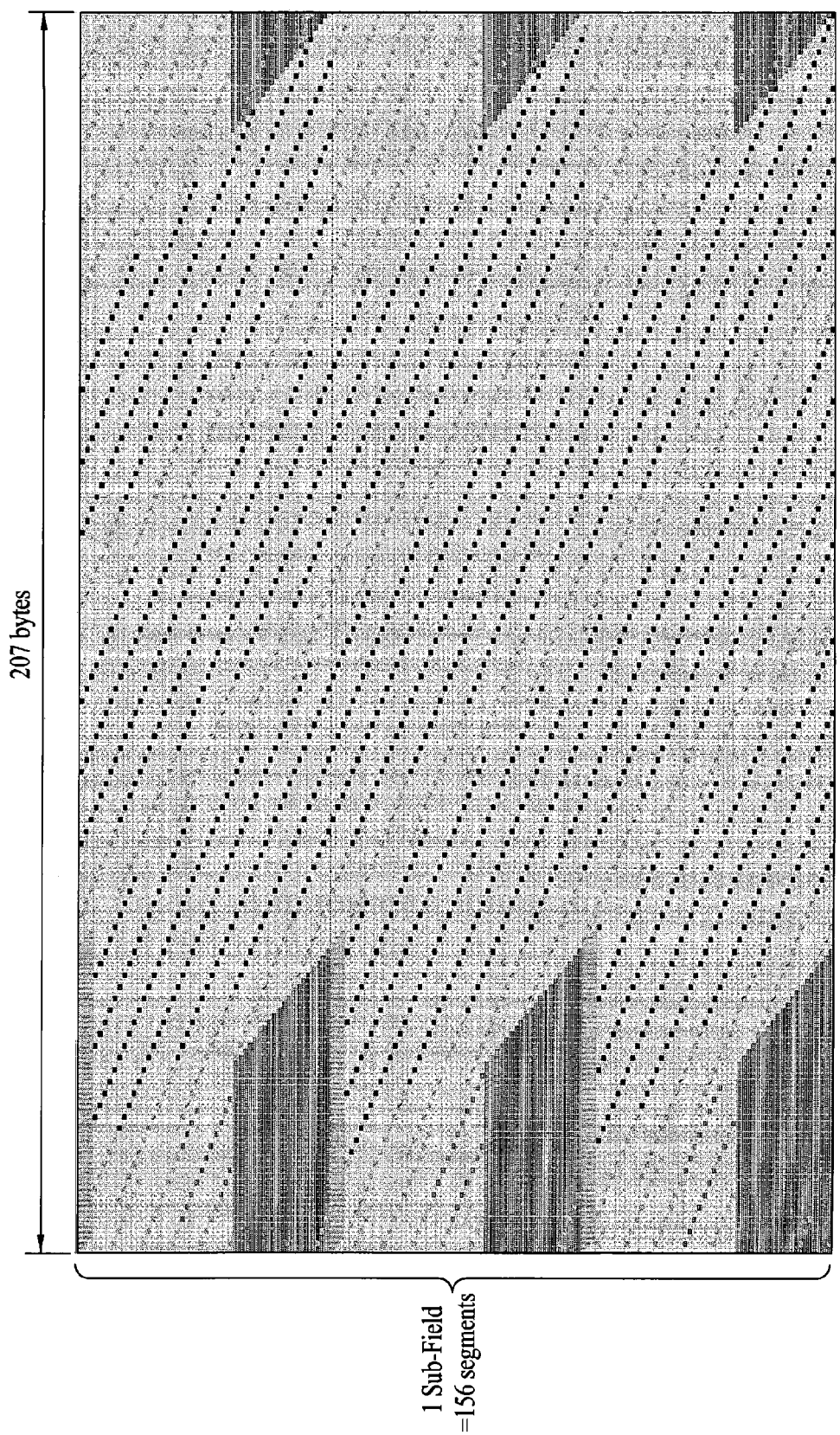
FIG. 17 illustrates an exemplary data structure of a sub-field, when the sub-package data structure of FIG. 16 is interleaved.
Figure 19:
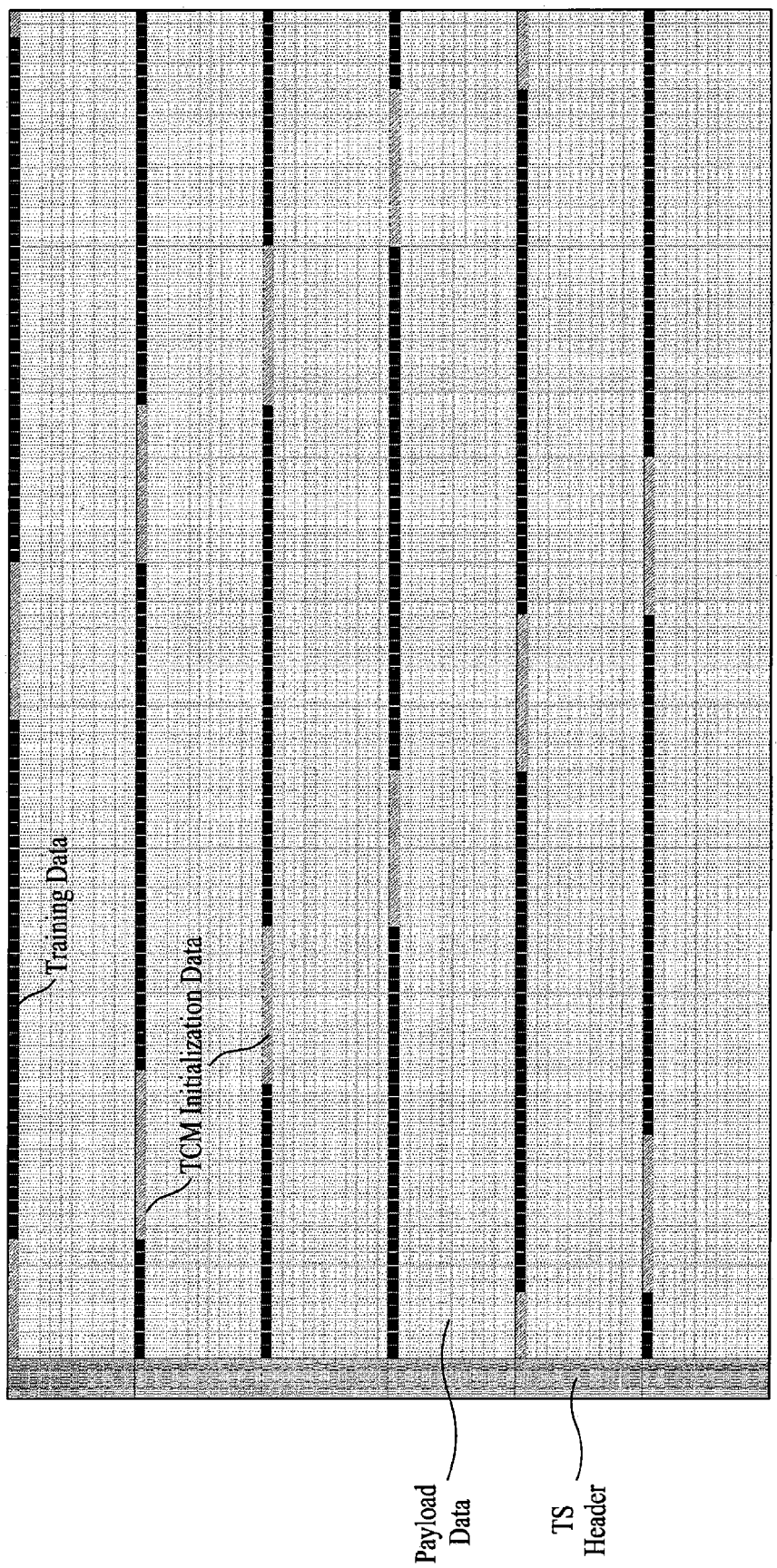
FIG. 19 to FIG. 22 respectively illustrate enlarged examples of the sub-package data structure shown in FIG. 16 divided into 4 equal portions.

FIG. 16 illustrates an exemplary data structure after data deinterleaving (i.e., data prior to interleaving), and FIG. 17 illustrates an exemplary data structure prior to data deinterleaving (i.e., data after interleaving). More specifically, the sub-field structure shown in FIG. 16 is generated from the sub-field formatter 214 and outputted to the data deinterleaver 215, so as to be deinterleaved. Thereafter, the sub-field structure shown in FIG. 16 is outputted from the data deinterleaver 215.

The sub-field formatter 214 aligns (or allocates) the known data place holders, the TCM initialization place holders, the MPEG header place holders, the RS parity place holders, the main service data place holders, and the data of the RS frame being turbo-encoded and outputted from the turbo processor 213, so that the data can be configured to have the structure shown in FIG. 17.

Actual data are transmitted to each place holder in a later process. For example, in the packet formatter 215, an actual MPEG header having a PID for identifying mobile service data is inserted in the MPEG header place holder. Also, in the packet formatter 215, actual known data and TCM initialization data may be inserted in the known data place holder and the TCM initialization place holder. Such functions may also be performed by the trellis encoding module 256 of the post-processor 130. In the packet multiplexer 120, actual main service data are inserted in the main service data place holder. The process of inserting actual data in each place holder will be described in more detail with reference to each corresponding block.

More specifically, the data structure being transmitted to the receiving system corresponds to the data structure after being interleaved, as shown in FIG. 16. At this point, actual data are inserted in each place holder. In other words, in the sub-field formatter 214, when using data excluding data that are turbo-encoded and outputted, instead of inserting actual data, data place holders are inserted and transmitted to the data deinterleaver 215. However, when transmitting the corresponding data to the receiving system, each place holder is replaced with the actual corresponding data, thereby being transmitted. Therefore, examples of allocating actual data will be used for describing sub-fields and sub-packages and tracks. In the present invention, a sub-field and a sub-packet have the same meaning. For example, reference is made to the sub-field in the packet level, and reference is made to the sub-package field in the symbol level.

According to an embodiment of the present invention, a sub-field consists of 156 data segments (i.e., a size corresponding to half of a VSB data field that does not include a field synchronization segment) and a sub-package consists of 156 data packets (i.e., 156 transport stream packets). In this case, one field consists of 312 data segments (i.e., a size corresponding to a VSB data field that does not include a field synchronization segment), and one package consists of 312 data packets (i.e., data size corresponding to one VSB data field). Herein, since one 207-byte data packet has the same data size as a data segment, the data packet prior to being data-interleaved may be used as a data segment.

Figure 14:
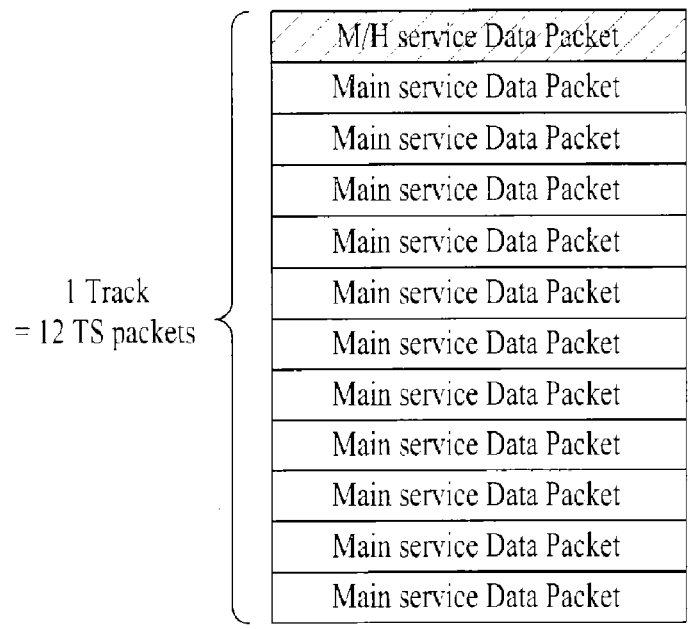
FIG. 14 illustrates an exemplary structure of one track according to an embodiment of the present invention.
Figure 15:
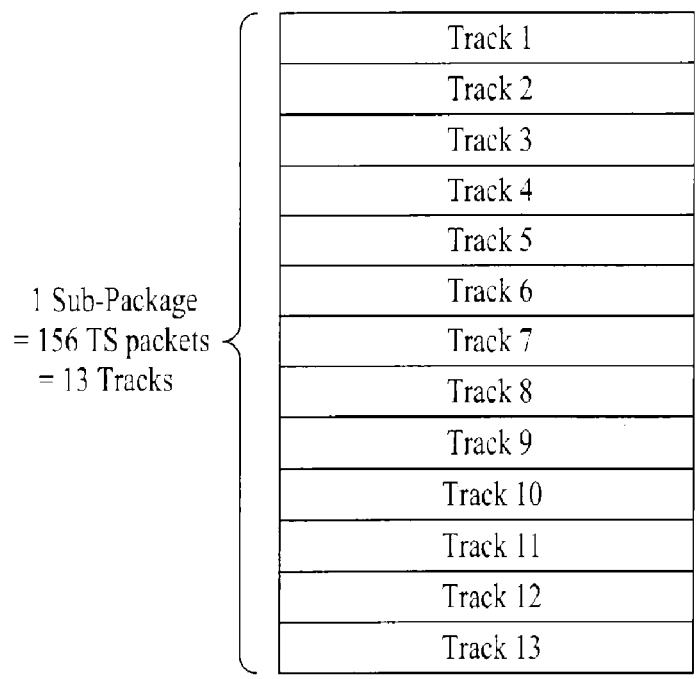
FIG. 15 illustrates an exemplary structure of one sub-package according to an embodiment of the present invention.

Also, according to the embodiment of the present invention, one track consists of 12 consecutive data packets (i.e., data segments), as shown in FIG. 14. Therefore, one sub-package consists of 13 consecutive tracks, as shown in FIG. 15.

At this point, the multiplexing unit of the M/H service data and the main service data within one track corresponds to one data packet. More specifically, an M/H service data packet is multiplexed with a main service data packet in packet units.

According to the embodiment of the present invention, the M/H service data packet includes at least one type of data required for mobile services, e.g., data turbo-encoded by the turbo processor 213, known data, and signaling data.

According to an embodiment of the present invention, a null packet PID (or a PID that is not used in the main service data packet) is assigned to the header of the M/H service data packet. Herein, the null packet (or a PID that is not used in the main service data packet) is assigned to the header of the M/H service data packet for the following reason. In the conventional receiving system that cannot receive data required for mobile services, by reading the PID, the corresponding reading system may discard (or delete) the data required for mobile services without having to process the corresponding data. More specifically, in the conventional receiving system, since the null packet PID corresponds to an unknown PID (or a unique PID that is not used in the main service data packet), the transport packet having the corresponding PID may be discarded without being processed.

Furthermore, the multiplexing rule within each track may be pre-decided, or may be decided during the multiplexing step. Also, the multiplexing rule may be different for each track, or may be identical for all tracks.

An example of allocating an M/H service data packet including known data in the first data packet of each track will now be described according to an embodiment of the present invention. And, only the M/H service data packets, or only the main service data packets, or both the M/H service data packets and the main service data packets may be assigned (or allocated) to the remaining data packets in each track excluding the first data packet. According to the embodiment of the present invention, the number of M/H service data packets being multiplexed in one track corresponds to a variable number. More specifically, the number of M/H service data packets being multiplexed in one track varies within the range of '1' to '12'.

FIG. 16 illustrates an exemplary data structure for a sub-package having an M/H service data packet including known data assigned to the first data packet of each track, after the data deinterleaving process.

FIG. 17 illustrates an exemplary data structure for a sub-field, when a sub-package data structure shown in FIG. 16 is interleaved.

FIG. 18 illustrates, in numbers, a first data packet format for each of the 13 tracks included in the sub-package of FIG. 16. Referring to FIG. 18, number '1' indicates the signaling data, number '2' indicates the RS parity data, number '3' represents the TCM initialization data, number '4' indicates the MPEG header data, and number '5' represents the known data (or training data).

Figure 20:
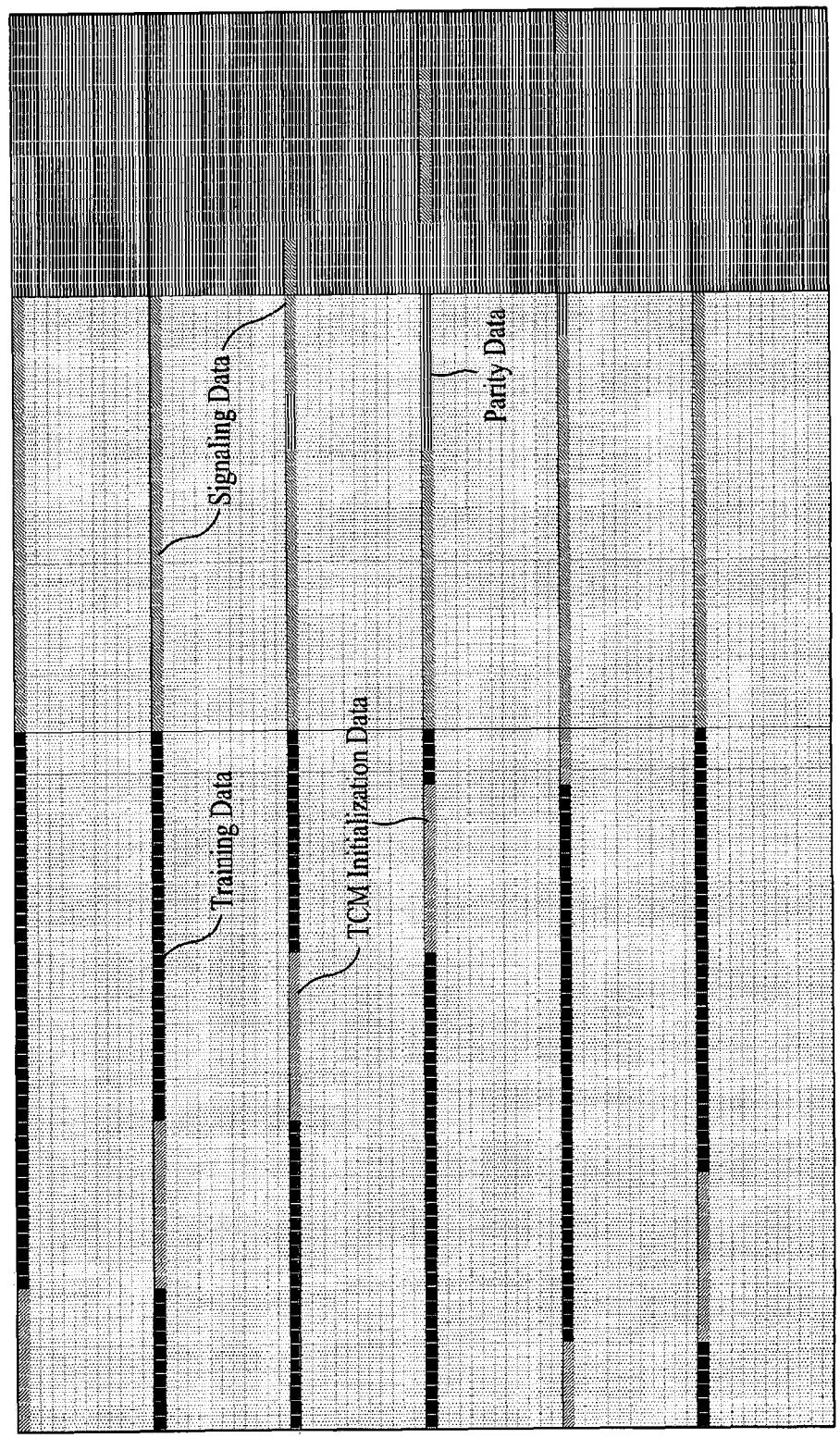
Figure 21:
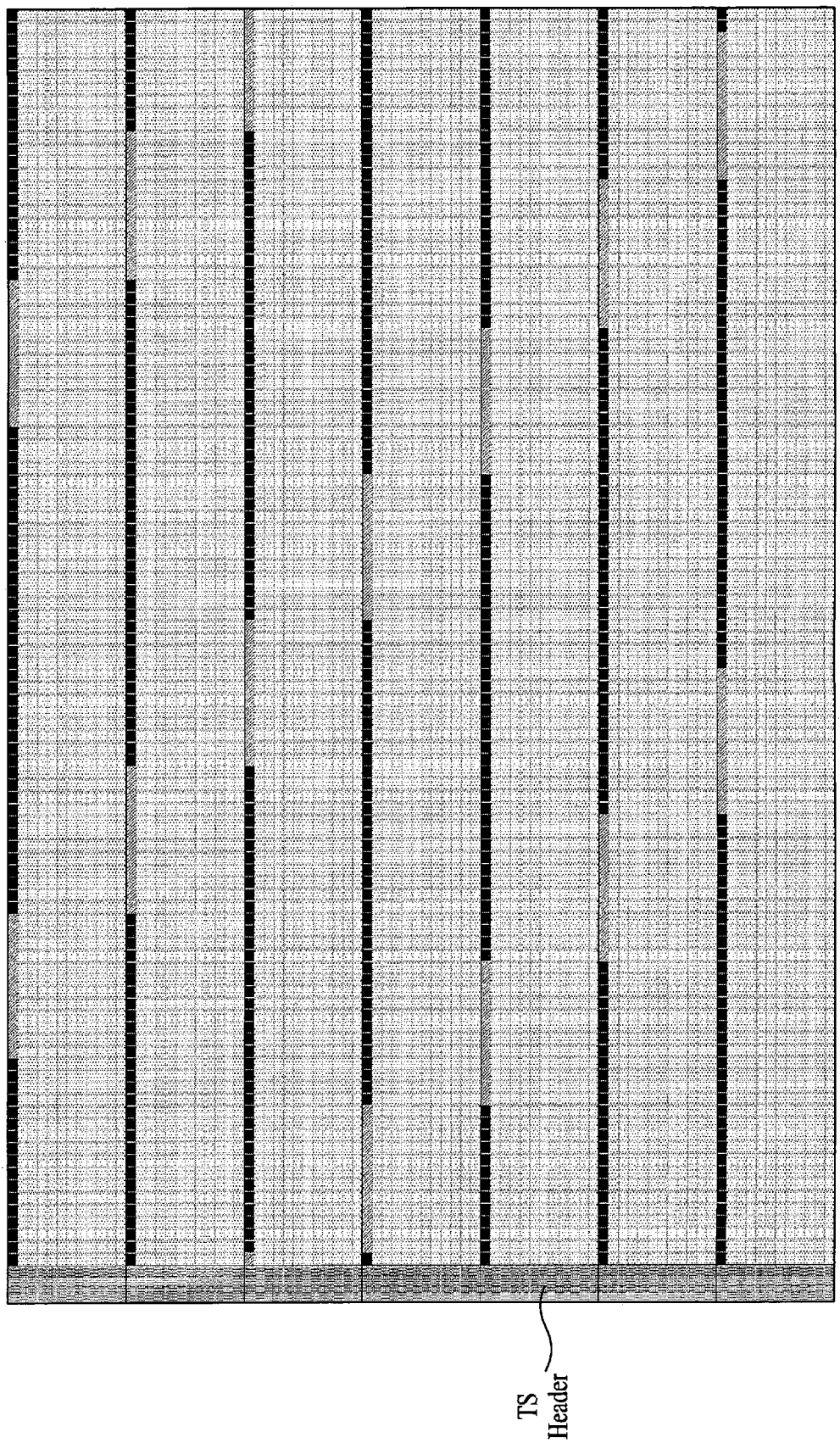
Figure 22:
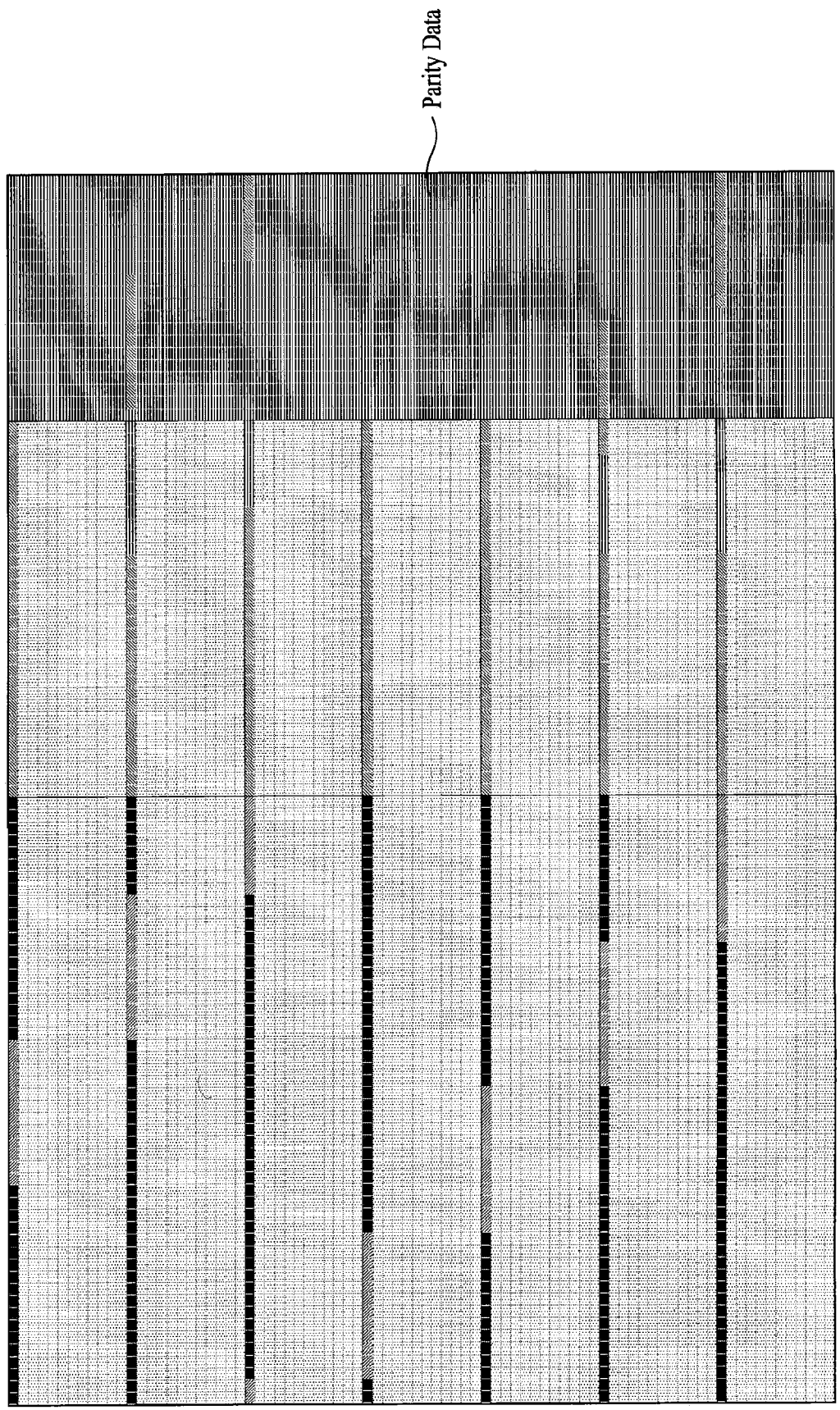
Figure 23:
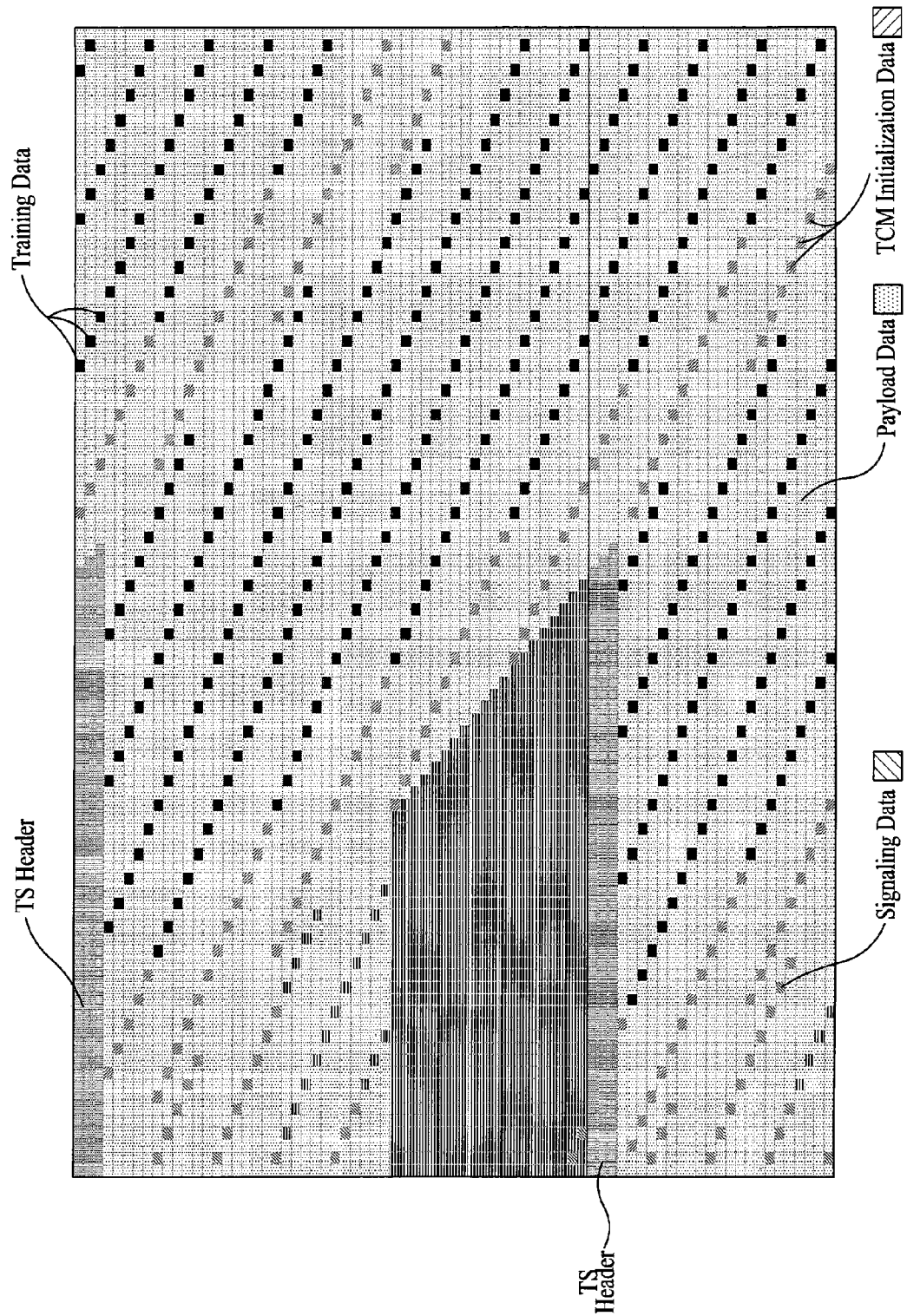
FIG. 23 to FIG. 26 respectively illustrate enlarged examples of the sub-field data structure shown in FIG. 17 divided into 4 equal portions.

FIG. 19 to FIG. 22 respectively illustrate enlarged examples of the sub-package data structure shown in FIG. 16 divided into 4 equal portions. More specifically, FIG. 19 corresponds to an enlarged view of an upper-left portion of the 4 equal portions of the sub-package data structure. FIG. 20 illustrates an enlarged view of an upper-right portion. FIG. 21 shows an enlarged view of a lower-left portion, and FIG. 22 illustrates an enlarged view of a lower-right portion.

Figure 24:
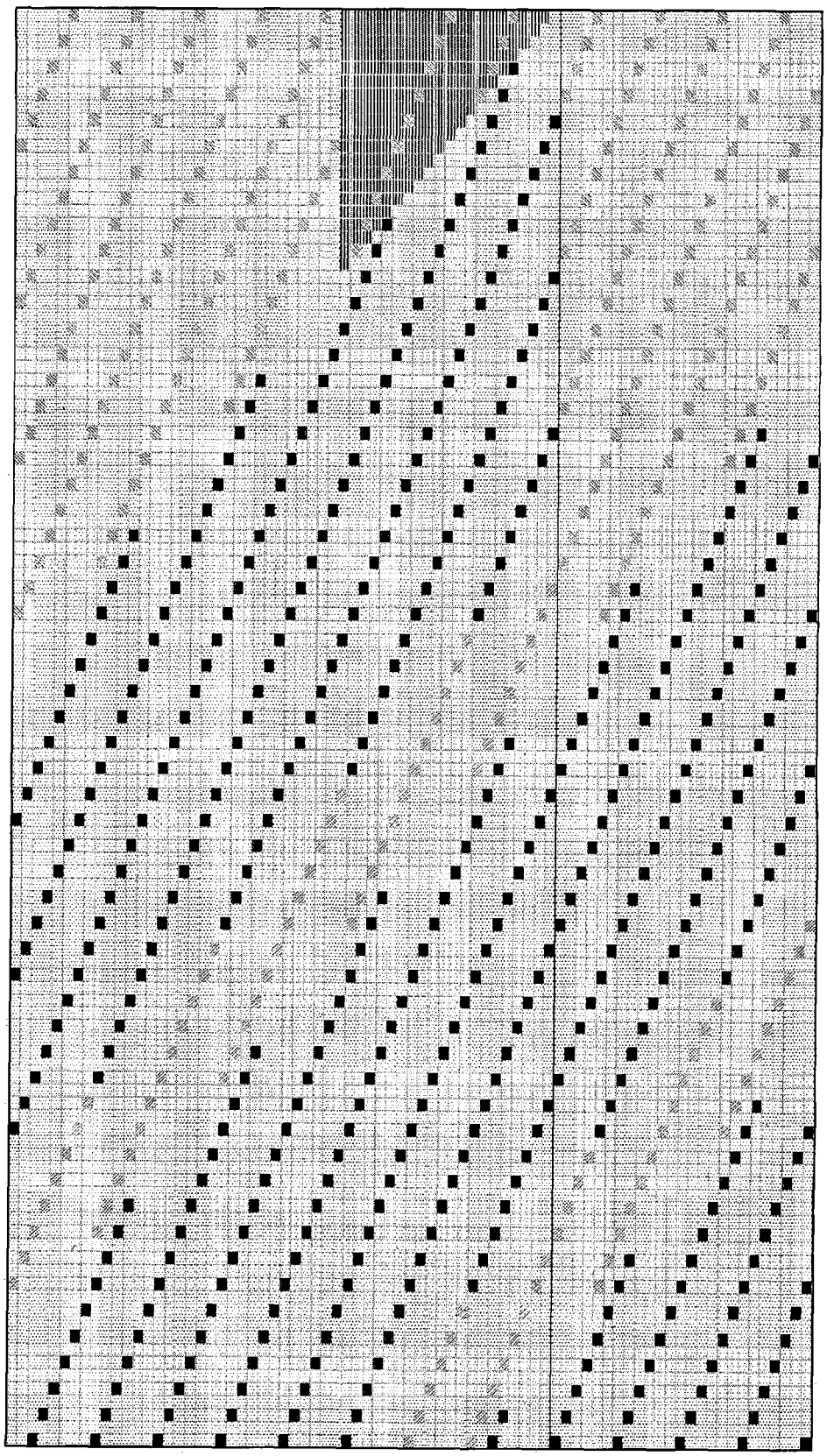
Figure 25:
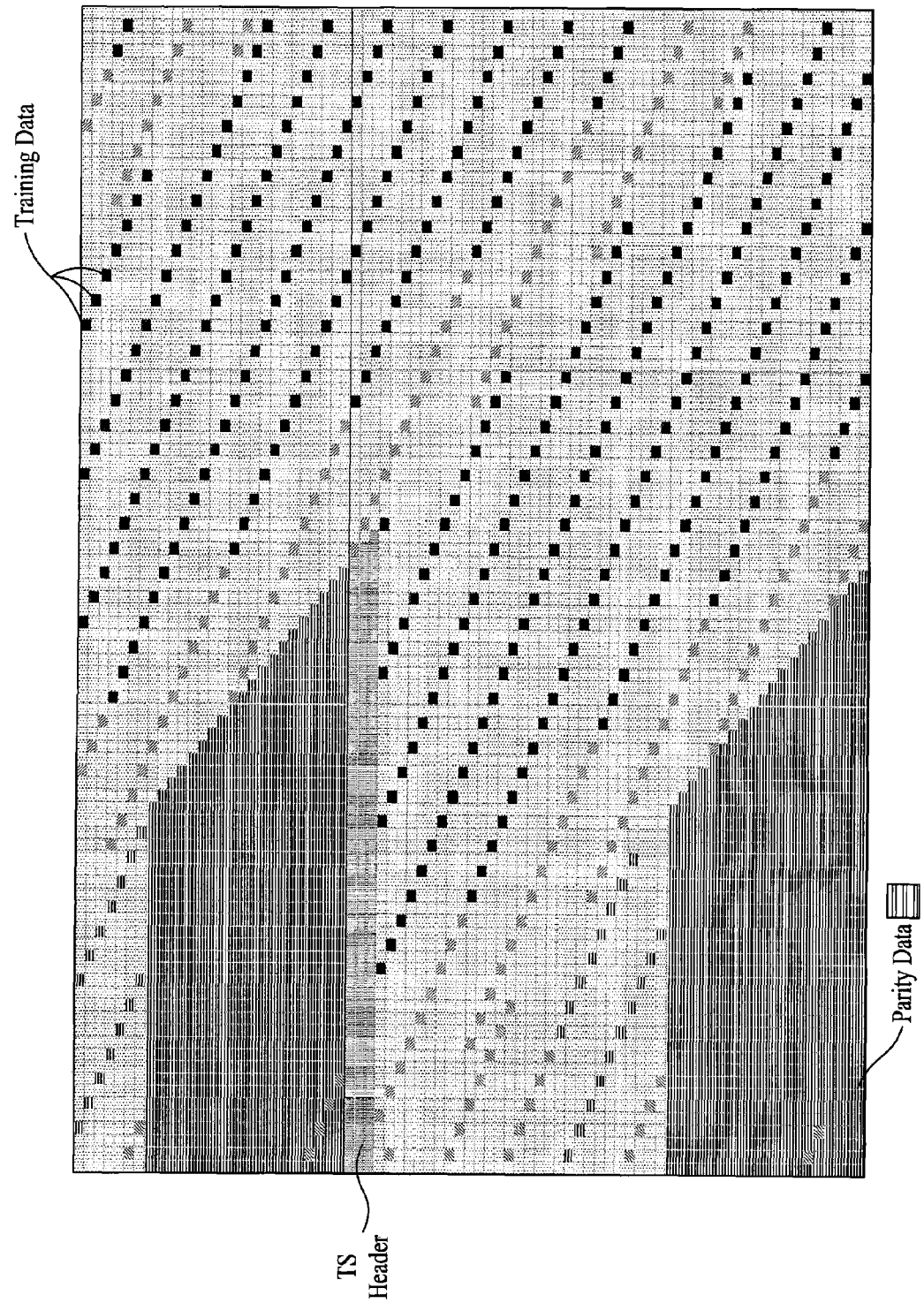
Figure 26:
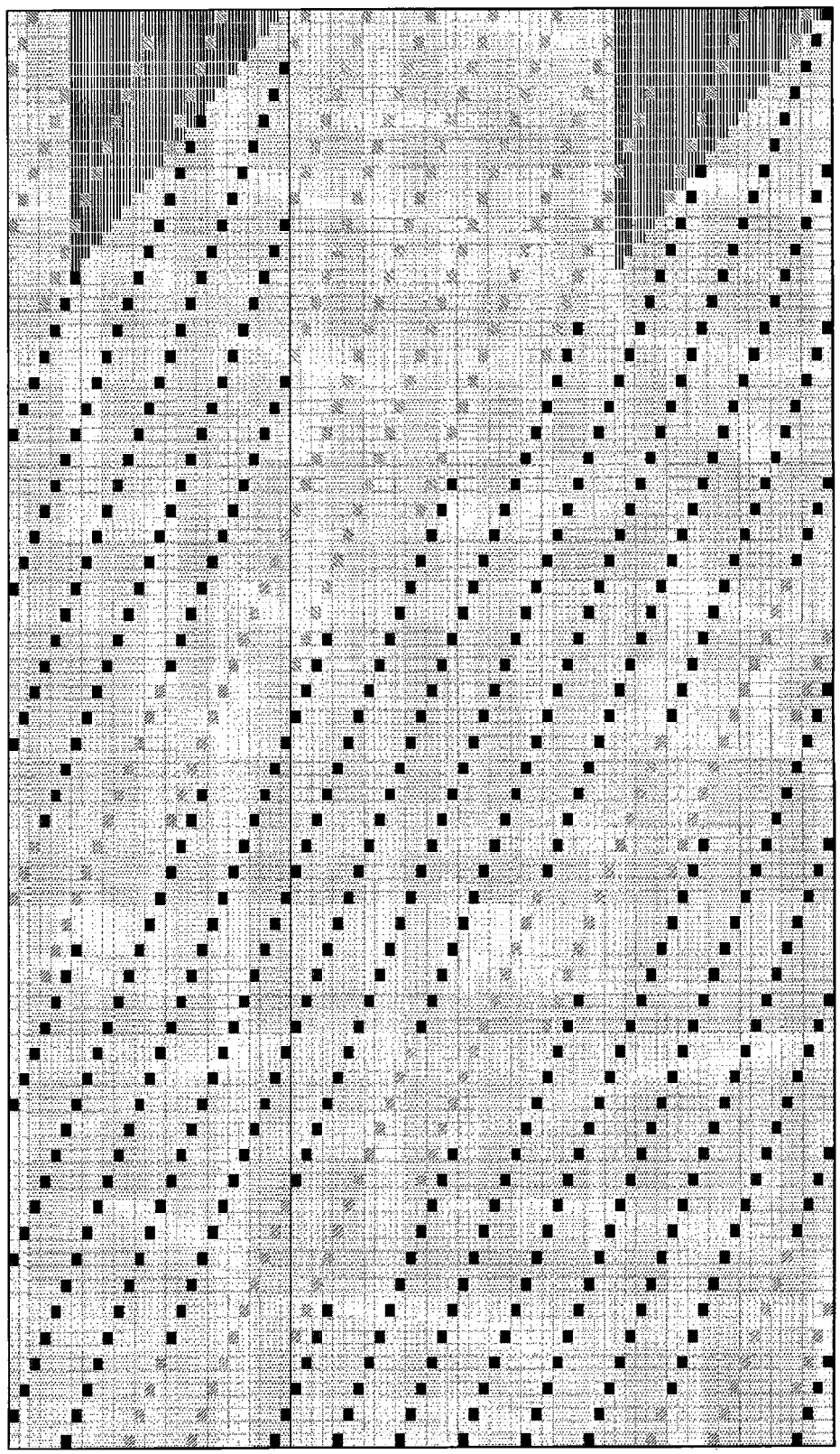

FIG. 23 to FIG. 26 respectively illustrate enlarged examples of the sub-field data structure shown in FIG. 17 divided into 4 equal portions. More specifically, FIG. 23 corresponds to an enlarged view of an upper-left portion of the 4 equal portions of the sub-field data structure. FIG. 24 illustrates an enlarged view of an upper-right portion. FIG. 25 shows an enlarged view of a lower-left portion, and FIG. 26 illustrates an enlarged view of a lower-right portion.

Referring to the data structures shown in FIG. 16 to FIG. 26, after the data deinterleaving process (i.e., prior to the data interleaving process), it is apparent that an M/H service data packet including known data is assigned to the first data packet for each track.

Also, referring to FIG. 18, in the M/H service data packet including the known data, MPEG header data are equally assigned to the first 3 bytes at the beginning of the data packet. Then, TCM data and known data are assigned to the next 153 bytes starting from the 4$^{th}$ data byte to the 156$^{th}$ data byte, based upon a pre-decided multiplexing rule. Thereafter, 31 bytes of signaling data and 20 bytes of RS parity data are assigned to the remaining 51 bytes of the M/H service data packet starting from the 157$^{th}$ data byte to the 207$^{th}$ data byte.

Herein, when data interleaving is performed as shown in FIG. 17, and FIG. 23 to FIG. 26, the known data are allocated so as to be uniformly distributed. Also, the TCM initialization data correspond to data for initializing the memory of each trellis encoder included in the trellis encoding module 256 within the post-processor 130.

Therefore, in the data structure prior to data interleaving, the allocation positions of the known data and the TCM initialization data are different for each track. Also, in the data structure prior to data interleaving, the allocation positions of the signaling data and the RS parity data may be the same in some tracks and different in other tracks. For example, the allocation positions of the signaling data and the RS parity data are the same for the 1$^{st}$, 2$^{nd}$, 6$^{th}$, 7$^{th}$, 10$^{th}$, and 11$^{th}$ tracks. More specifically, the signaling data are allocated to 31 bytes starting from the 157$^{th}$ byte to the 187$^{th}$ byte of the data packet included in the corresponding track. And, the RS parity data are allocated to 20 bytes starting from the 188$^{th}$ byte to the 207$^{th}$ byte of the data packet included in the corresponding track. However, apart from the above-described track, the allocation positions of the signaling data and the RS parity data are different for each of the remaining tracks.

If the sub-packages having the same patterns, as shown in FIG. 16, and FIG. 19 to FIG. 22, are continuously transmitted, the known data are uniformly distributed, after data interleaving, as shown in FIG. 17, and FIG. 23 to FIG. 26.

Herein, the known data that are uniformly distributed, as described above, may enhance the receiving performance of the receiving system. For example, in the receiving system, synchronization and channel equalization may be performed with enhanced stability and accuracy.

Meanwhile, any one of the M/H service data packet and the main service data packet is allocated to the data packet excluding the first data packet of each track. In this case, RS parity data are allocated to 20 bytes starting from the 188$^{th}$ byte to the 207$^{th}$ byte of each data packet.

The sub-field formatter 214 allocates the turbo-encoded data and each place holder so that the data packet can have a sub-field structure, as shown in FIG. 17.

The output of the sub-field formatter 214 is inputted to the data interleaver 215. And, the data interleaver 215 deinterleaves the turbo-encoded data and each place holder being outputted from the sub-field formatter 214, as an inverse process of the data interleaving process, thereby outputting the deinterleaved data to the packet formatter 216.

If, a data structure shown in FIG. 17 is inputted to the data deinterleaver 215, the output of the data deinterleaver 215 corresponds to a sub-package structure, as shown in FIG. 16.

Among the deinterleaved and inputted data, the packet formatter 216 removes the RS parity place holders assigned for the deinterleaving process, and inserts an MPEG header having a null packet PID (or a PID that is not used in the main service data packet) in a 4-byte MPEG header place holder within the M/H service data packet. Herein, the null packet PID (or a PID that is not used in the main service data packet) is assigned to the header of the M/H service data packet for the following reason. In the conventional receiving system that cannot receive data required for mobile services, by reading the PID, the corresponding reading system may discard (or delete) the data required for mobile services without having to process the corresponding data.

When the sub-field formatter 214 inserts the known data place holder, the packet formatter 216 may insert actual known data in the known data place holder, or may output the known data place holder without modification for a replacement insertion in a later process. Also, actual signaling data are inserted in the signaling data place holder. The signaling data may be inputted to the packet formatter 216 after being encoded through a separate turbo-encoding process. Herein, the signaling data correspond to additional (or supplemental) data required for acquiring and processing mobile services in the receiving system. The signaling data may include encoding information, such as a multiplexing rule for each data type, an FEC mode, and a turbo code.

Each data packet of the packet formatter 216 has an MPEG TS packet structure and is inputted to the packet multiplexer 120.

The packet multiplexer 120 inserts actual data for main service in place holders for a main service data packet being outputted from the packet formatter 216. More specifically, the packet multiplexer 120 receives a 4-byte MPEG header and a 184-byte main service data, so as to insert the 4-byte MPEG header in the MPEG header place holders within the main service data packet and to insert the 184-byte main service data in the main service data place holders within the main service data packet. More specifically, the output of the packet multiplexer 120 is provided to the post-processor 130.

Figure 27:
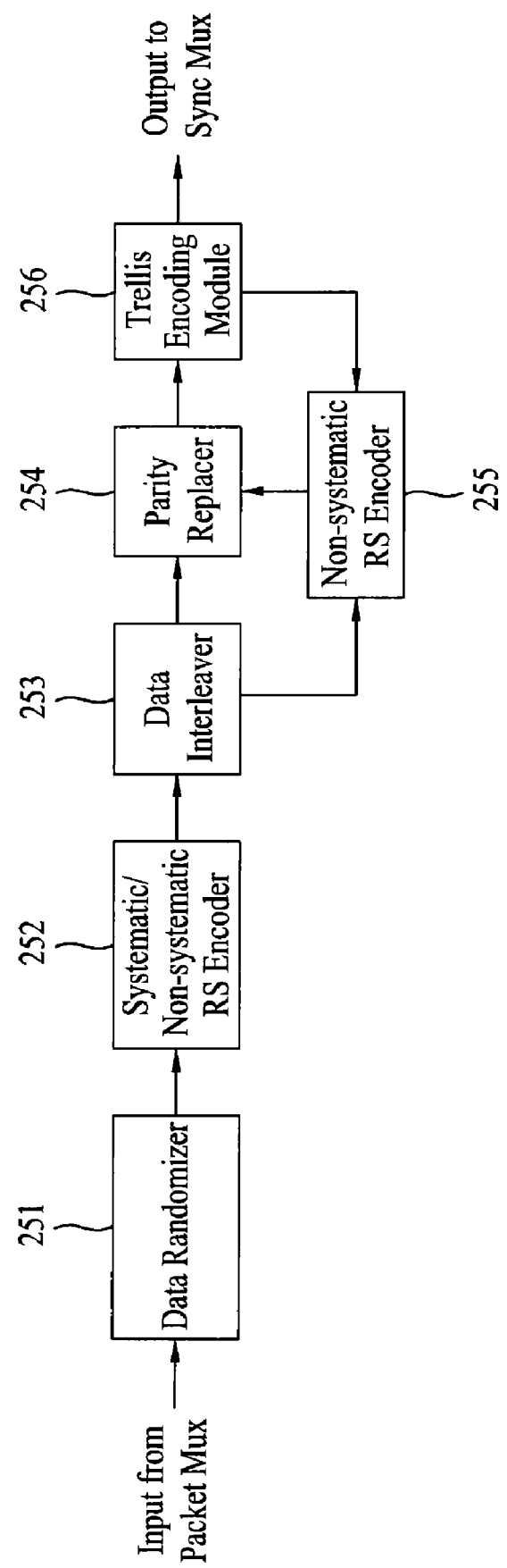
FIG. 27 illustrates a detailed block diagram showing a structure of a post-processor of the transmitting system shown in FIG. 1 according to another embodiment of the present invention.

FIG. 27 illustrates a block diagram showing an example of the post-processor 130 according to the present invention. The post-processor 130 includes a data randomizer 251, a RS encoder/non-systematic RS encoder 252, a data interleaver 253, a parity replacer 254, a non-systematic RS encoder 255, and a trellis encoding module 256.

If the inputted data correspond to the main service data packet, the data randomizer 251 performs the same randomizing process as that of the conventional randomizer. More specifically, the synchronization byte within the main service data packet is deleted. Then, the remaining 187 data bytes are randomized by using a pseudo random byte generated from the data randomizer 251. Thereafter, the randomized data are outputted to the RS encoder/non-systematic RS encoder 252.

On the other hand, if the inputted data correspond to the M/H service data packet, the data randomizer 251 may randomize only a portion of the data packet. For example, if it is assumed that a randomizing process has already been performed in advance on the M/H service data packet by the pre-processor 110, the data randomizer 251 deletes the synchronization byte from the 4-byte MPEG header included in the M/H service data packet and, then, performs the randomizing process only on the remaining 3 data bytes of the MPEG header. Thereafter, the randomized data bytes are outputted to the RS encoder/non-systematic RS encoder 252. More specifically, the randomizing process is not performed on the remaining portion of the mobile service data excluding the MPEG header. In other words, the remaining portion of the M/H service data packet is directly outputted to the RS encoder/non-systematic RS encoder 252 without being randomized. Also, the data randomizer 251 may or may not perform a randomizing process on the signaling data, the known data and the TCM initialization data place holders included in the M/H service data packet.

The RS encoder/non-systematic RS encoder 252 performs an RS encoding process on the data being randomized by the data randomizer 251 or on the data bypassing the data randomizer 251, so as to add 20 bytes of RS parity data. Thereafter, the processed data are outputted to the data interleaver 253.

Herein, if the inputted data correspond to the main service data packet or the M/H service data packet which does not include known data, the RS encoder/non-systematic RS encoder 252 performs the same systematic RS encoding process as that of the conventional broadcasting system, thereby adding the 20-byte RS parity data at the end of the 187-byte data. Alternatively, if the inputted data correspond to the M/H service data packet including known data, the RS encoder/non-systematic RS encoder 252 performs a non-systematic RS encoding process. At this point, the 20-byte RS parity data obtained from the non-systematic RS encoding process are inserted in a pre-decided parity byte place within the M/H service data packet.

The data interleaver 253 corresponds to a byte unit convolutional interleaver.

The output of the data interleaver 253 is inputted to the parity replacer 254 and to the non-systematic RS encoder 255.

Meanwhile, a process of initializing a memory within the trellis encoding module 256 is primarily required in order to decide the output data of the trellis encoding module 256, which is located after the parity replacer 254, as the known data pre-defined according to an agreement between the receiving system and the transmitting system.

Additionally, a value of the trellis memory initialization data is decided and generated based upon a memory status of the trellis encoding module 256. The generated initialization data instead of the TCM initialization data holders inputted to the trellis encoding module 256. Further, due to the newly replaced initialization data, a process of newly calculating the RS parity and replacing the RS parity, which is outputted from the data interleaver 253, with the newly calculated RS parity is required.

Therefore, the non-systematic RS encoder 255 receives the M/H service data packet including the initialization data place holders, which are to be replaced with the actual initialization data, from the data interleaver 253 and also receives the initialization data from the trellis encoding module 256.

Among the inputted M/H service data packet, the initialization data place holders are replaced with the initialization data, and the RS parity data that are added to the M/H service data packet are removed and processed with non-systematic RS encoding. Thereafter, the new RS parity obtained by performing the non-systematic RS encoding inserts in a pre-decided parity byte place within the M/H service data packet. The M/H service data packet is outputted to the parity replacer 255.

Accordingly, the parity replacer 255 selects the output of the data interleaver 253, when the data outputted from the data interleaver 253 is the data within the main service data packet or the data within M/H service data packet which does not include the TCM initialization data holder. The parity replacer 255 selects the output of the non-systematic RS encoder 254, when the data within M/H service data packet including the TCM initialization data holder. The selected data from the parity replacer 255 is outputted to the trellis encoding module 256.

The trellis encoding module 256 converts the byte-unit data to symbol units and performs a 12-way interleaving process so as to trellis-encode the received data. Thereafter, the processed data are outputted to the synchronization multiplexer 140.

The synchronization multiplexer 140 inserts a field synchronization signal and a segment synchronization signal to the data outputted from the trellis encoding module 256 and, then, outputs the processed data to the pilot inserter 150. Herein, the data having a pilot inserted therein by the pilot inserter 150 are modulated by the modulator 160 in accordance with a pre-determined modulating method (e.g., a VSB method). Thereafter, the modulated data are transmitted to each receiving system though the radio frequency (RF) up-converter 170.

Demodulating Unit of Receiving System

Figure 28:
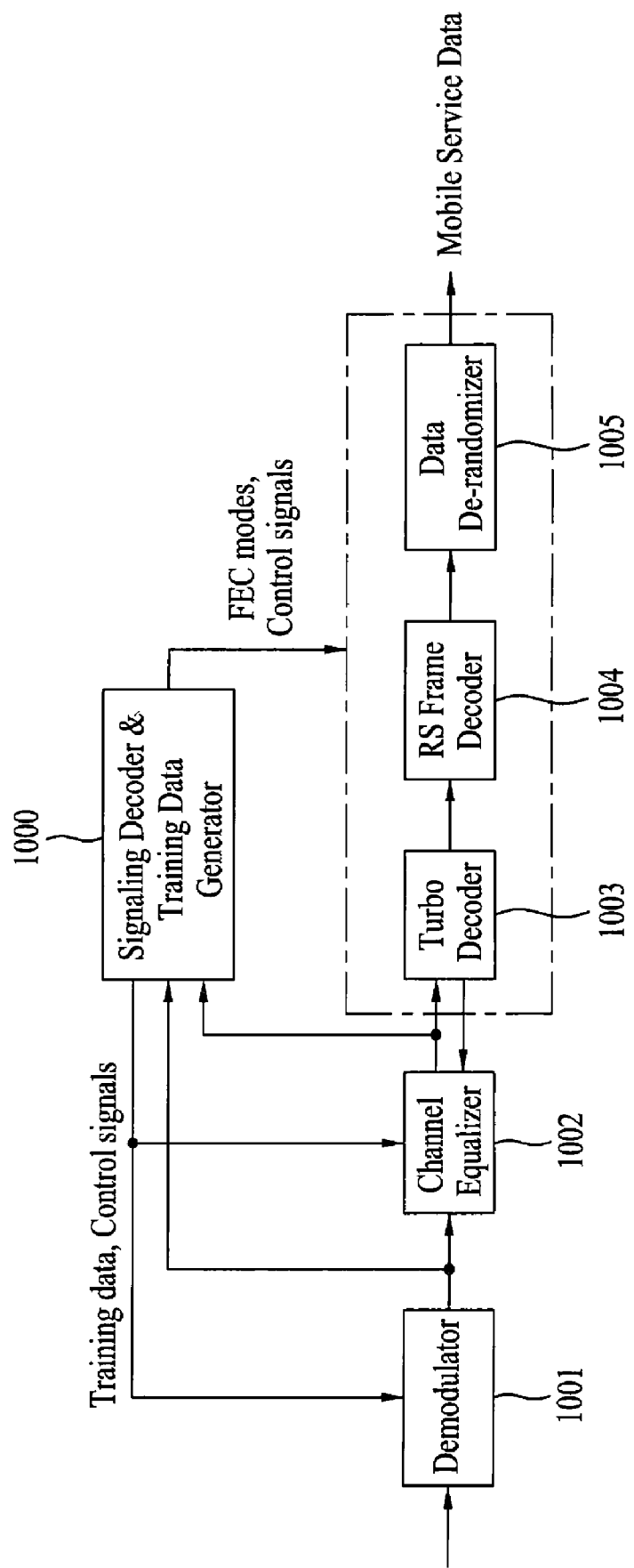
FIG. 28 illustrates a block diagram showing a structure of a demodulating unit within the receiving system according to an embodiment of the present invention.

FIG. 28 illustrates a block diagram showing a structure of a demodulating unit within a digital broadcast receiving system according to the present invention. The demodulating unit of FIG. 28 uses known data being uniformly distributed and transmitted from the transmitting system, so as to perform carrier synchronization recovery, frame synchronization recovery, and channel equalization, thereby enhancing the receiving performance.

Referring to FIG. 28, the demodulating unit includes a controller 1000, a demodulator 1001, a channel-equalizer 1002, a turbo decoder 1003, a RS frame decoder 1004, and a data derandomizer 1005.

In case of FIG. 28, the blocks used for receiving and processing main service data are omitted. When required, a data deinterleaver, an RS decoder, and a data derandomizer may be further included in order to process main service data.

More specifically, a tuner tunes to a frequency of a particular channel and down-converts the tuned frequency to an intermediate frequency (IF) signal. Then, the down-converted data are outputted to the demodulator 1001. At this point, according to an embodiment of the present invention, the down-converted data pass through an analog/digital converter (ADC) (not shown), which converts an analog IF signal of a passband to a digital IF signal, so as to be inputted to the demodulator 1001.

The demodulator 1001 performs self gain control, carrier recovery, and timing recovery processes on the inputted digital IF signal, thereby modifying the digital IF signal to a baseband signal. Then, the demodulator 1001 outputs the newly converted baseband signal to the channel-equalizer 1002.

The channel-equalizer 1002 compensates the distortion of the channel included in the demodulated signal and then outputs the error-compensated signal to the turbo decoder 1003 and the controller 1000.

The controller 1000 decodes signaling data from the data being demodulated or channel-equalized and then inputted, thereby providing the decoded signaling data to the required block. The controller 1000 also extracts known data information from the data being demodulated or channel-equalized and then inputted, thereby providing the extracted known data information to the required block. According to an embodiment of the present invention, the data being inputted to controller 1000 has a sub-field data structure, as shown in FIG. 17.

More specifically, the controller 1000 detects known data positions, which have been inserted by the transmitting system so as to be uniformly distributed, from the inputted data. Then, the controller 1000 outputs the detected position information to the demodulator 1001 and the channel-equalizer 1002 along with a known data symbol sequence generated from the detected positions. Furthermore, the controller 1000 decodes the signaling data from the inputted data, thereby providing the decoded signaling data to the turbo decoder 1003, the RS frame decoder 1004, and the data derandomizer 1005. In addition to the known data information and signaling information, the controller 1000 also generates a control signal required for data processing, thereby outputting the generated control signal to a required block.

The demodulator 1001 uses the known data symbol sequence during the timing and/or carrier recovery, thereby enhancing the demodulating performance. Similarly, the channel-equalizer 1002 uses the known data so as to enhance the equalizing performance. Moreover, the decoding result of the turbo decoder 1003 may be fed-back to the channel-equalizer 1002, thereby enhancing the equalizing performance.

According to an embodiment of the present invention, the channel-equalizer 1002 estimates a channel impulse response (CIR) from a known data section or a field synchronization section, so as to perform channel equalization. In the present invention, when the channel-equalizer 1002 uses the estimated CIR from the known data section or the field synchronization section, so as to perform channel equalization, each of the estimated CIRs may be directly used. Alternatively, a plurality of the estimated CIRs may also be either interpolated or extrapolated so as to create a new CIR, which is then used for the channel equalization process.

Herein, when a value $F(Q)$ of a function $F(x)$ at a particular point Q and a value $F(S)$ of the function $F(x)$ at another particular point S are known, interpolation refers to estimating a function value of a point within the section between points Q and S. Linear interpolation corresponds to the simplest form among a wide range of interpolation operations. The linear interpolation described herein is merely exemplary among a wide range of possible interpolation methods. And, therefore, the present invention is not limited only to the examples set forth herein.

Alternatively, when a value $F(Q)$ of a function $F(x)$ at a particular point Q and a value $F(S)$ of the function $F(x)$ at another particular point S are known, extrapolation refers to estimating a function value of a point outside of the section between points Q and S. Linear extrapolation is the simplest form among a wide range of extrapolation operations. Similarly, the linear extrapolation described herein is merely exemplary among a wide range of possible extrapolation methods. And, therefore, the present invention is not limited only to the examples set forth herein.

Turbo Decoder

Meanwhile, according to the embodiment of the present invention, the data being inputted to the turbo decoder 1003 after being channel-equalized by the channel-equalizer 1002 correspond to the data having both turbo-encoding and trellis-encoding performed thereon by the transmitting system. More specifically, the data correspond to an RS frame being inputted to the sub-field formatter from the transmitting system. The RS frame includes mobile service data of an RS frame payload, RS parity data added to the RS frame payload, and CRC data. More specifically, according to the embodiment of the present invention, the known data, the signaling data, the MPEG header, the RS parity data, which are included in the sub-field as shown in FIG. 17, are removed, thereby leaving only the RS frame data, which are inputted to turbo decoder 1003.

Herein, the process of removing data may be performed when data are outputted from the channel equalizer 1002 to the turbo decoder 1003, based upon the control of the controller 1000. Alternatively, the data removing process may be performed in a separate block or in the controller 1000.

More specifically, when the inputted data correspond to data turbo-encoded by the turbo processor 213 of the transmitting system and trellis-encoded by the trellis encoding module 256 of the transmitting system, the turbo decoder 1003 performs an inverse process transmitting system, i.e., performs trellis-decoding and turbo-decoding on the corresponding data. At this point, the turbo processor of the transmitting system may be considered as an outer encoder, and the trellis encoding module may be considered as an inner encoder.

When decoding such concatenated codes, in order to allow the turbo decoder 1003 to maximize its performance of decoding externally encoded data, the decoder of the internal code should output a soft decision value.

The turbo decoder 1003 may use for turbo decoding process by inputting information associated with turbo encoding of encoding information included in the signaling data.

The turbo decoder 1003 uses at least one of a SCCC mode, a PCCC mode, a variable SCCC mode, and a hybrid mode for the mobile service data, so as to perform turbo-decoding on the inputted data.

Figure 30:
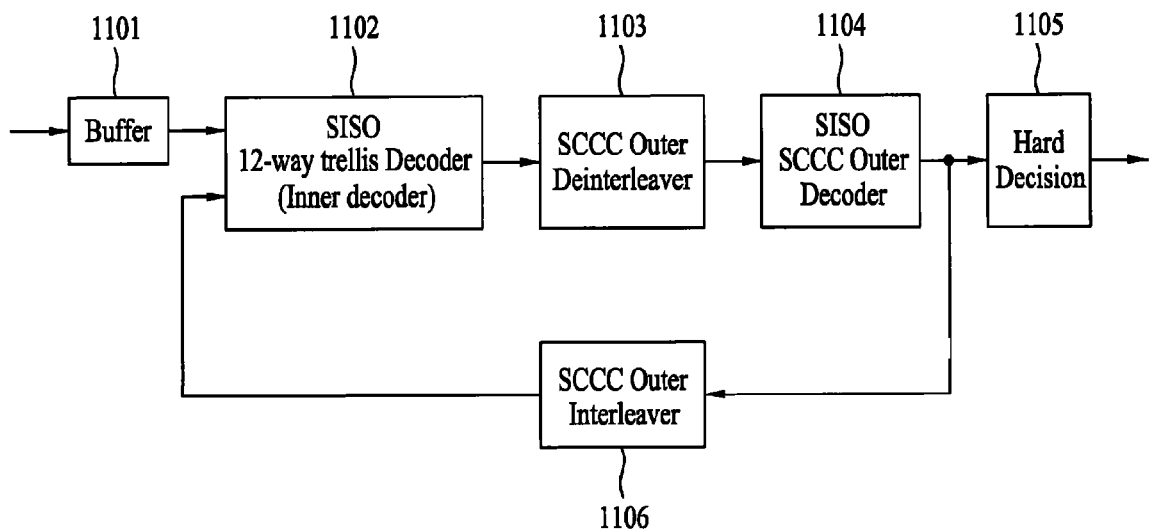
FIG. 30 illustrates a block diagram showing a structure of a turbo decoder according to an embodiment of the present invention.

FIG. 30 illustrates a block diagram showing a structure of a turbo decoder performing an SCCC mode turbo-decoding process according to an embodiment of the present invention. More specifically, FIG. 30 shows an exemplary turbo decoder corresponding to a turbo processor of SCCC mode of the transmitting system, as shown in FIG. 4.

Referring to FIG. 30, the turbo decoder 1003 includes a buffer 1101, an inner decoder 1102, an SCCC outer deinterleaver 1103, an SCCC outer decoder 1104, a hard decision unit 1105, and an SCCC outer interleaver 1106.

The buffer 1101 temporarily stores values of mobile service data symbols (including an RS parity data symbol and CRC data symbols added during the RS frame encoding process), and then repeatedly outputs for M number of times the stored symbol values to the inner decoder 1102 at a turbo decoding length (TDL) size so as to perform the turbo-decoding process. The turbo decoding length may also be referred to as a turbo block, and the size corresponds to a block size used for the turbo-encoding process in the transmitting system. Herein, M represents a pre-decided number for repeating the turbo-decoding process.

The inner decoder 1102 includes a soft input soft output (SISO) 12-way trellis coded modulation (TCM) decoder being in correspondence with a 12-way trellis encoder within the transmitting system. The inner decoder 1102 performs an inverse process of the 12-way trellis encoder by performing 12-way trellis-decoding on the inputted symbol values. Herein, an SISO decoding algorithm, such as a maximum a posteriori probability (MAP) or a soft-out viterbi algorithm (SOVA), may be used the decoding algorithm of each trellis decoder within the inner decoder 1102.

Figure 31:
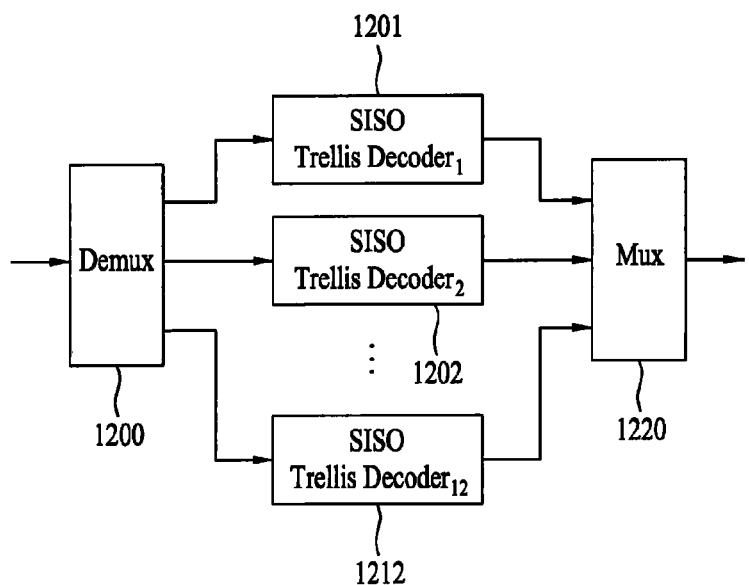
FIG. 31 illustrates a detailed block diagram of an SISO 12-way trellis decoder shown in FIG. 30 according to an embodiment of the present invention.

FIG. 31 illustrates a detailed block diagram of the inner decoder 1102 according to an embodiment of the present invention. Herein, the inner decoder 1102 includes a demultiplexer 1200, 12 SISO trellis decoders 1201 to 1212, and a multiplexer 1220.

The demultiplexer 1200 matches the output of the buffer 1101 and the output of the SCCC outer interleaver 1106, so as to output the matched output data to any one of the 12 SISO trellis decoders. The multiplexer 1220 multiplexes the soft decision value of the data symbol being decoded and outputted from the 12 SISO trellis decoders 1201 to 1212. Then, the multiplexer 1220 outputs the multiplexed decision value to the SCCC outer deinterleaver 1103.

More specifically, the inner decoder 1102 receives each of the output symbol value from the buffer 1101 and the soft-decision value from the SCCC outer decoder 1104 equivalent to the TDL, thereby performing TCM decoding on each symbol.

At this point, the soft-decision values outputted from the SCCC outer decoder 1104 are matched to be in a one-to-one (1:1) correspondence with respective symbol positions, which correspond to the TDL, being outputted from the buffer 1101. Then, the matched values are inputted to the corresponding SISO trellis decoder within the inner decoder 1102. More specifically, the symbol values being outputted from the buffer 1101 are matched with data being turbo-decoded and fed-back, based upon the same position within the corresponding turbo block (TDL). Thereafter, the matched values are outputted to the corresponding SISO trellis decoder within the inner decoder 1102. For example, when the turbo-decoded data corresponds to the third symbol value within the turbo block, the corresponding turbo-decoded data are matched with the third symbol value within the turbo block, which is outputted from the buffer 1101, thereby being outputted to the inner decoder 1102.

This process is repeated for as many times as a predetermined repetition number for the turbo decoding process. Thereafter, the data of a next turbo block are outputted from the buffer 1101, thereby repeating the turbo-decoding process.

The output of each SISO trellis decoder within the inner decoder 1102 indicates a reliability level of each symbol inputted to the trellis encoder of the transmitting system with respect to the transmitted symbols. For example, since two bits configure one symbol, the input of the trellis encoder in the transmitting system may respectively output a log likelihood ratio (LLR) between the likelihood (or probability) of one bit being equal to '1' and the likelihood (or probability) of one bit being equal to '0' for each of an upper bit and a lower bit. Herein, LLR represents a log value of a ratio between a value of the likelihood of an input bit being '1' and a value of the likelihood of an input bit being '0'.

The output of the inner decoder 1102 is outputted to the SCCC outer deinterleaver 1103, thereby being deinterleaved.

The SCCC outer deinterleaver 1103 performs an inverse process of symbol interleaving performed by the SCCC outer interleaver 403 included in the transmitting system. In other words, the SCCC outer deinterleaver 1103 performs deinterleaving on the soft-decision value of a data symbol being outputted from the inner decoder 1102. The block size being used by the SCCC outer deinterleaver 1103 for the deinterleaving process is identical to the interleaving size (i.e., BK) of an actual symbol of the SCCC outer interleaver within the transmitting system. This is because the turbo-decoding process is performed between the inner decoder 1102 and the SCCC outer decoder 1104.

The input and output of the SCCC outer deinterleaver 1103 both correspond to soft-decision values. Herein, the deinterleaved soft-decision value is outputted to the SCCC outer decoder 1104.

The SCCC outer decoder 1104 performs an inverse process of the SCCC outer encoder 402 included in the transmitting system by symbol decoding the output of the SCCC outer deinterleaver 1103.

At this point, the SCCC outer decoder 1104 outputs two types of soft-decision values. One soft-decision value corresponds to a soft-decision value being matched with the output symbol of the SCCC outer encoder 402 (hereinafter referred to as a first soft-decision value). And, the other soft-decision value corresponds to a soft-decision value being matched with an input bit of the SCCC outer encoder 402 (hereinafter referred to as a second soft-decision value). The first soft-decision value represents a reliability level of the output symbol (i.e., two bits) corresponding to the SCCC outer encoder 402. Herein, a log likelihood ratio (LLR) between the likelihood (or probability) of one bit being equal to '1' and the likelihood (or probability) of one bit being equal to '0' is outputted for each of an upper bit and a lower bit, which configure one symbol.

The first soft decision value is symbol-interleaved by the SCCC outer interleaver 1106 like the SCCC outer interleaver 403 of the transmitting system, and fed-back to the inner decoder 1102.

The soft-decision values being outputted from the SCCC outer interleaver 1106 are matched with mobile service data symbol positions corresponding to the TDL being outputted from the buffer 1101, so as to be in a one-to-one (1:1) correspondence. Thereafter, the matched soft-decision values are inputted to the inner decoder 1102.

Each time the TDL-sized symbols are turbo-decoded, no value is fed-back from the SCCC outer interleaver 1106 to the inner decoder 1102 at the starting point of the first decoding process. In this case, null data are fed-back to the inner decoder 1102.

The second soft-decision value represents a reliability level of the input symbol bits corresponding to the SCCC outer encoder 402. Herein, the second soft-decision value is marked as the log likelihood ratio (LLR) between the likelihood (or probability) of one bit being equal to '1' and the likelihood (or probability) of one bit being equal to '0', thereby being outputted to the hard-decision unit 1105.

The hard-decision unit 1105 receives the second soft-decision value from the SCCC outer decoder 1104, so as to be temporarily stored. Then, the hard-decision unit 1105 hard-decides the temporarily stored second soft-decision value, thereby outputting the hard-decided result to the RS frame decoder 1004. For example, the hard-decision unit 1105 overwrites the second soft-decision value of the SCCC outer decoder 1104 until the turbo-decoding process is performed for M number of times. Then, when all M number of turbo-decoding processes for on TDL is completed, the corresponding second soft-decision value is hard-decided. The hard-decision result is outputted to the RS frame decoder 1004. According to another embodiment of the present invention, the soft-decision value may be directly outputted to the RS frame decoder 1004 without modification.

At this point, the number of regressive turbo decoding processes between the inner decoder 1102 and the SCCC outer decoder 1104 may be defined and decided while taking into consideration the hardware complexity and error correction performance of the present invention. In this case, if the number of decoding processes increases, the error correction performance may be enhanced. However, the hardware configuration may become more complex.

Figure 32:
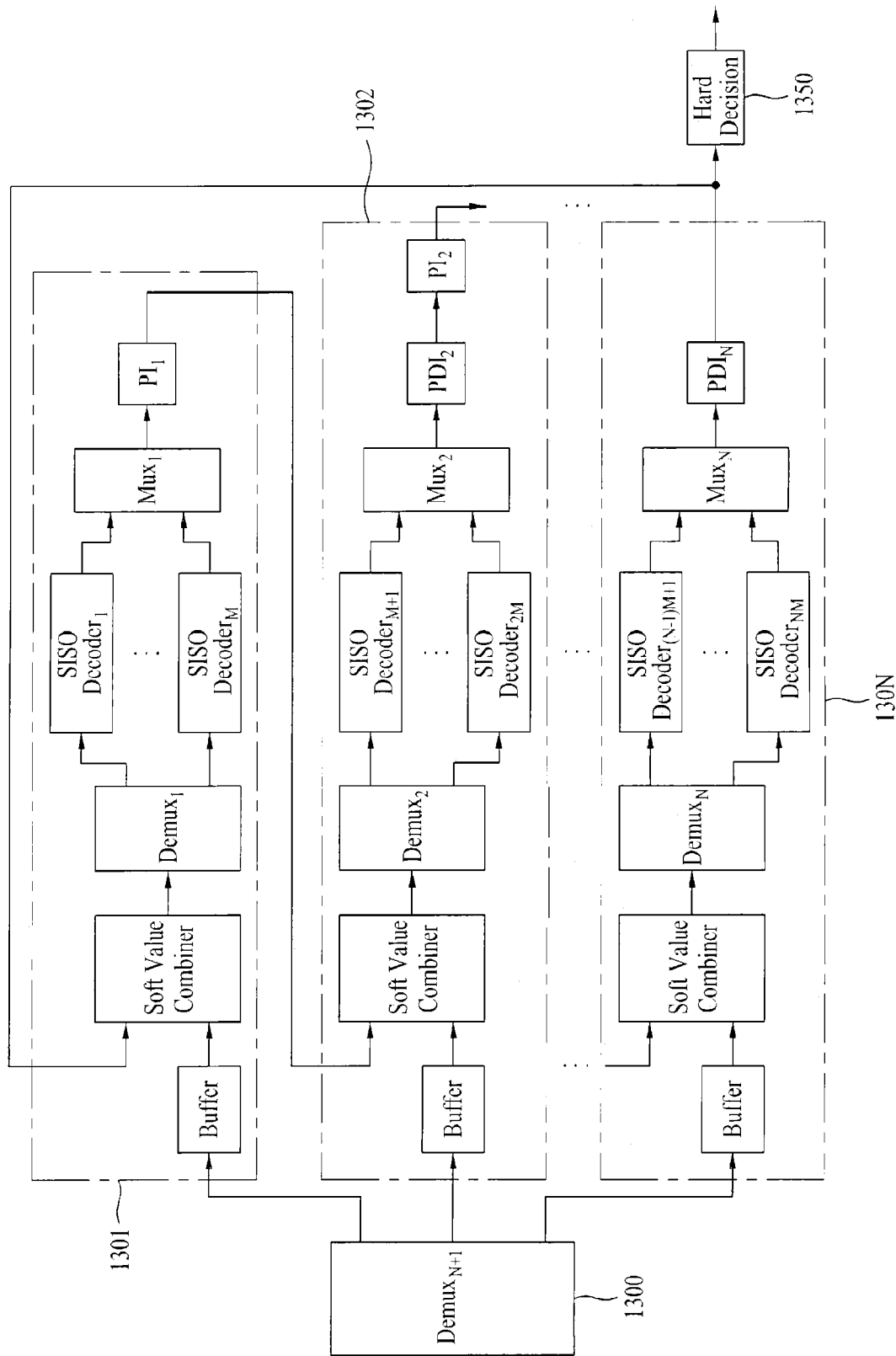
FIG. 32 illustrates a block diagram showing a structure of a turbo decoder according to another embodiment of the present invention.

FIG. 32 illustrates a block diagram showing a structure of a turbo decoder for performing a PCCC mode turbo-decoding. More specifically, FIG. 32 shows an example of a turbo decoder corresponding to a PCCC mode turbo processor, which is configured as shown in FIG. 6, in the transmitting system.

The turbo decoder of FIG. 32 includes a demultiplexer 1300, N number of decoders 1301 to 130N, and a hard decision unit 1350.

Among the N number of decoders 1301 to 130N, the first decoder 1301 includes a buffer, a soft value combiner, a demultiplexer, M number of SISO decoders, a multiplexer, and a PCCC interleaver (PI).

Also, among the N number of decoders 1301 to 130N, the last decoder 130N also includes a buffer, a soft value combiner, a demultiplexer, M number of SISO decoders, a multiplexer, and a PCCC deinterleaver (PDI).

Apart from the first and last decoders 1301 and 130N, each of the remaining decoders further includes a PCCC deinterleaver (PDI) between the multiplexer and the PCCC interleaver (PI).

The output of the PCCC interleaver included in the first decoder 1301 is fed-back to the second soft value combiner. The output of the PCCC interleaver included in the last decoder 130N is fed-back to the first soft value combiner. With the exception of the first and last decoders, the output of the PCCC interleaver for each of the remaining decoders is fed-back to the soft value combiner of the next decoder.

The SISO decoder within the turbo decoder performs a decoding process corresponding to an inverse process of the PCCC outer encoder shown in FIG. 6.

According to an embodiment of the present invention, the input and output data of the SISO decoder correspond to LLR values, which are log values with respect to the soft-decision values.

Also, the PCCC interleaver operates identically as the PCCC interleaver shown in FIG. 6. And, the PCCC deinterleaver performs the inverse process of the PCCC interleaver.

Herein, the total number of SISO decoders is equal to '12'. In other words, the value of (N×M) should be equal to '12'.

For example, when the number (N) of decoders is equal to '12', only one SISO decoder is provided in each decoder. In this case, the demultiplexer and the multiplexer within each decoder may be omitted, or the input data may bypass the demultiplexer and the multiplexer. In another example, when the number (N) of decoders is equal to '4', three SISO decoders are provided to each decoder. In yet another example, when the number (N) of decoders is equal to '1', and if only the first decoder operates, 12 SISO decoders are provided to the first decoder.

More specifically, the output data of the channel equalizer 1002 are inputted to the demultiplexer 1300 of the turbo decoder 1003. The demultiplexer 1300 identifies the respective data as symbols corresponding to each branch of the turbo processor included in the transmitting system, which are then respectively outputted to the first to Nth decoder 1301 to 130N.

The buffer of each decoder stores the input data corresponding to one block. Then, while the turbo decoding process is being performed, the input data are repeatedly outputted to the soft value combiner as many times as the repetition cycle.

The soft value combiner of each decoder extracts an extrinsic value from each data being PCCC interleaved and fed-back, so as to add the output value of the corresponding buffer. Thereafter, the soft value combiner outputs the added (or combined) value to the corresponding SISO decoder through the demultiplexer. The extrinsic value may correspond to information on the symbol that is inputted to the SISO decoder, or may correspond to information of each bit that configures the corresponding symbol. Since the function of the buffer is identical to that of the buffer included in the SCCC mode turbo decoder shown in FIG. 30, a detailed description of the same will be omitted for simplicity.

In case of the first decoder 1301, as an inverse process of the PCCC outer encoder included in the transmitting system, each SISO decoder decodes the inputted data, thereby outputting the decoded data to the multiplexer. Then, the multiplexer multiplexes the output of at least one of the SISO decoders and outputs the multiplexed data to the PCCC interleaver. The PCCC interleaver operates identically as the PCCC interleaver included in the transmitting system. And, the PCCC interleaved data are outputted to the soft value combiner of the second decoder. This process is repeatedly performed until the end of the turbo-decoding cycle. Thereafter, the soft-decision value deinterleaved and outputted from the PCCC deinterleaver of the last decoder is inputted to the hard decision unit 1350.

The hard decision unit 1350 hard-decides the soft-decision value being outputted from the PCCC deinterleaver. Subsequently, the hard decision unit 1350 outputs the hard-decided result to the RS frame decoder 1004. More specifically, this process is repeated for a predetermined number of repetition cycles of the turbo-decoding process. Thereafter, the data of the next block pass through the demultiplexer 1300 so as to be inputted to the first to Nth decoders 1301 to 130N, thereby repeating the turbo-decoding process. Also, at this point, the number of regressive turbo decoding processes of the turbo decoder may be defined and decided while taking into consideration the hardware complexity and error correction performance of the present invention. In this case, if the number of decoding processes increases, the error correction performance may be enhanced. However, the hardware configuration may become more complex.

Figure 33:
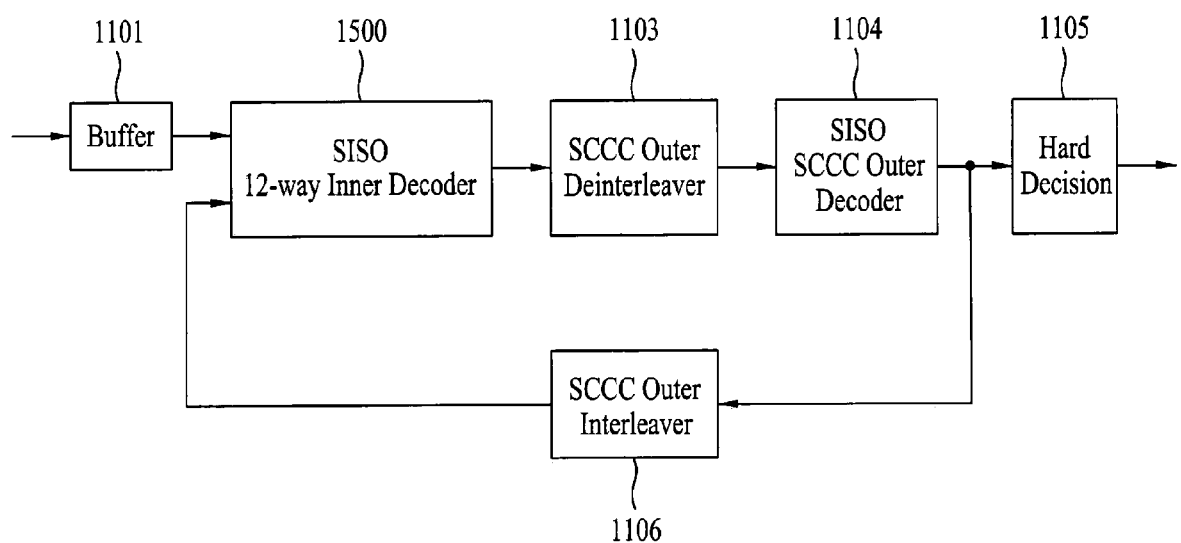
FIG. 33 illustrates a block diagram showing a structure of a turbo decoder according to yet another embodiment of the present invention.

FIG. 33 illustrates a block diagram showing a structure of a turbo decoder for performing a variable SCCC mode turbo-decoding. More specifically, FIG. 32 shows an example of a turbo decoder corresponding to an SCCC mode encoder including 12 inner encoders, and which is configured as shown in FIG. 12, in the transmitting system.

The turbo decoder of FIG. 33 includes a buffer 1101, an SISO 12-way inner decoder 1500, an SCCC outer deinterleaver 1103, an SCCC outer decoder 1104, a hard decision unit 1105, and an SCCC outer interleaver 1106. With the exception of the SISO 12-way inner decoder 1500, the structure and operations of the turbo decoder shown in FIG. 33 are identical as those of the buffer 1101, the SCCC outer deinterleaver 1103, the SCCC outer decoder 1104, the hard decision unit 1105, and the SCCC outer interleaver 1106 included in the turbo decoder of FIG. 31. Therefore, detailed description of the same will be omitted for simplicity.

Figure 34:
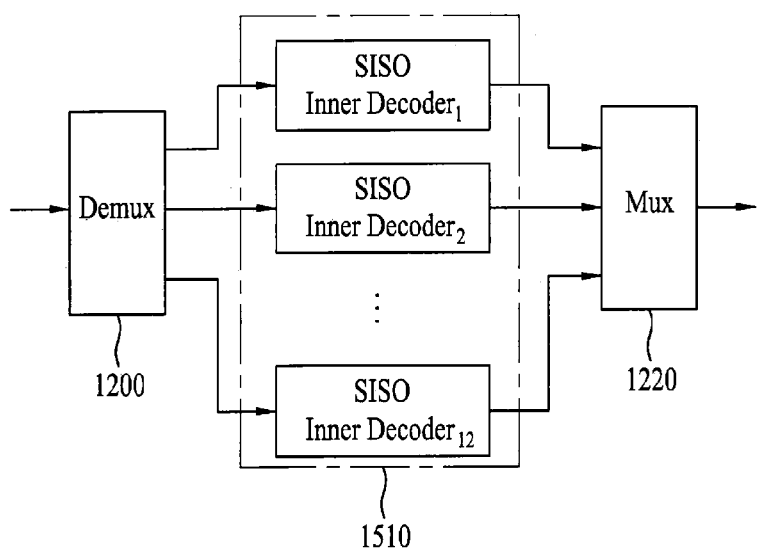
FIG. 34 illustrates a detailed block diagram of an SISO 12-way inner decoder shown in FIG. 33 according to an embodiment of the present invention.

FIG. 34 illustrates a detailed block diagram showing a structure of the SISO 12-way inner decoder 1500 according to an embodiment of the present invention.

Referring to FIG. 34, the SISO 12-way inner decoder 1500 includes a demultiplexer 1200, 12 SISO inner decoders 1510, and a multiplexer 1220. Herein, since the structures and operations of the demultiplexer 1200 and the multiplexer 1220 are identical to those of the demultiplexer 1200 and the multiplexer 1220 showing in FIG. 32, detailed description of the same will be omitted for simplicity.

The 12 SISO inner decoders 1510 each corresponds to the 12 inner encoders 412 of FIG. 12 and decodes the input data as the inverse process of each inner encoder.

Figure 35:
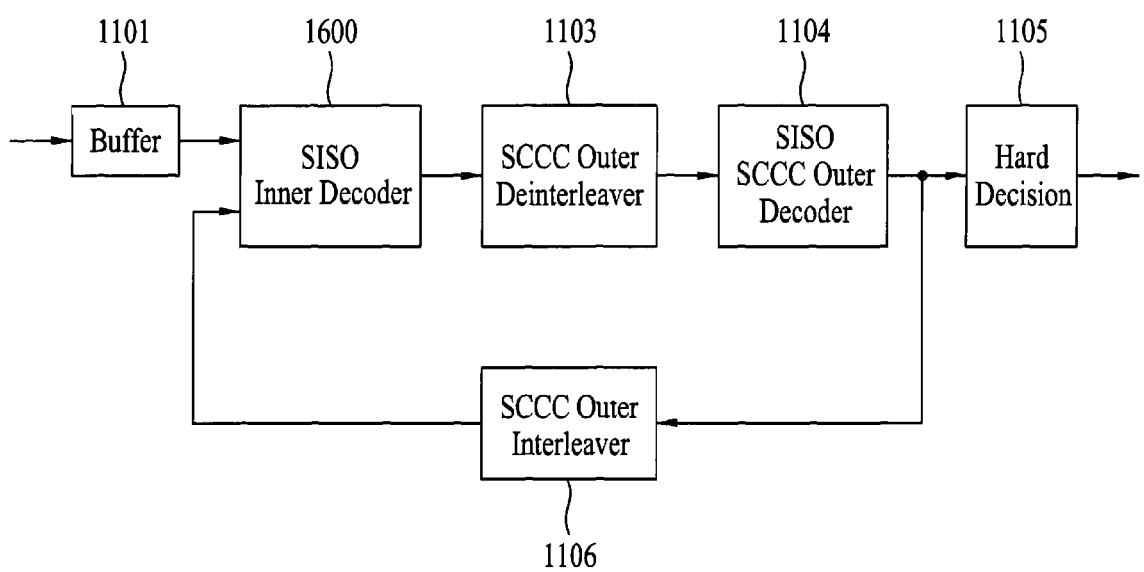
FIG. 35 illustrates a block diagram showing a structure of a turbo decoder according to yet another embodiment of the present invention.

FIG. 35 illustrates a block diagram showing a structure of a turbo decoder for performing a hybrid mode turbo-decoding process. More specifically, FIG. 35 shows an example of a turbo decoder corresponding to a hybrid mode turbo processor included in the transmitting system, as shown in FIG. 13.

Herein, referring to FIG. 35, the turbo decoder includes a buffer 1101, an SISO inner decoder 1600, an SCCC outer deinterleaver 1103, an SCCC outer decoder 1104, a hard decision unit 1105, and an SCCC outer interleaver 1106. With the exception of the SISO inner decoder 1600, the structure and operations of the turbo decoder shown in FIG. 35 are identical as those of the buffer 1101, the SCCC outer deinterleaver 1103, the SCCC outer decoder 1104, the hard decision unit 1105, and the SCCC outer interleaver 1106 included in the turbo decoder of FIG. 31. Therefore, detailed description of the same will be omitted for simplicity.

Furthermore, according to an embodiment of the present invention, the detailed structure of the SISO inner decoder 1600 applies the PCCC mode turbo decoder shown in FIG. 32. In this case, reference may be made to FIG. 32 for the structure and operations of the SISO inner decoder 1600. Therefore, detailed description of the same will be omitted for simplicity.

The data regressive-turbo-decoded by any one of the turbo decoders shown in FIG. 30 to FIG. 35 are inputted to the RS frame decoder 1004. Among the encoding information included in and received through the signaling data, the RS frame decoder 1004 receives RS-frame-associated information, such as FEC mode, so as to correct the error generated in the data of the RS frame turbo-decoded and outputted. For example, the RS frame decoder 1004 performs the inverse process of the RS frame encoder included in the transmitting system, so as to correct the errors generated in the data of the corresponding RS frame. Thereafter, the RS frame decoder 1004 outputs the mobile service data having the RS parity data and CRC data removed therefrom to the derandomizer 1005.

Figure 29:
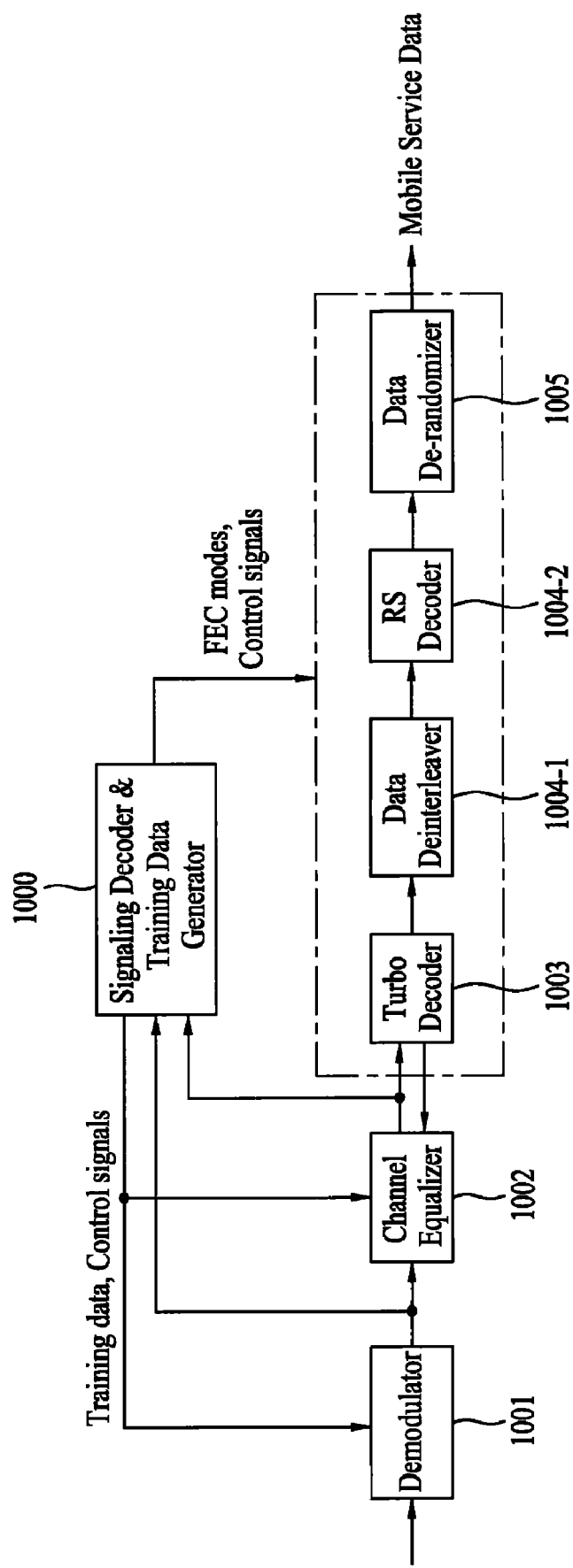
FIG. 29 illustrates a block diagram showing a structure of a demodulating unit within the receiving system according to another embodiment of the present invention.

Meanwhile, when the pre-processor of the transmitting system is configured as shown in FIG. 3, the demodulating unit may include a data deinterleaver 1004-1 and an RS decoder 1004-2, as shown in FIG. 29, instead of the RS frame decoder 1004. The data deinterleaver 1004-1 performs an inverse process of the data interleaver 212-2 shown in FIG. 3. In other words, the data deinterleaver 1004-1 deinterleaves the data turbo-decoded and outputted and RS-decodes the output data, so as to correct errors, thereby outputting the error-corrected data to the data randomizer 1005. The derandomizer 1005 performs a derandomizing process on the mobile service data that are outputted from the RS frame decoder 1004 or the RS decoder 1004-2. This process corresponds to an inverse process of the randomizer included in the transmitting system. By outputting the derandomized mobile service data, the original mobile service data transmitted from the transmitting system can be obtained.

The present invention has the following advantages. More specifically, the present invention is robust against (or resistant to) any error that may occur when transmitting mobile service data through a channel. And, the present invention is also highly compatible to the conventional receiving system. Moreover, the present invention may also receive the mobile service data without any error even in channels having severe ghost effect and noise.

By transmitting a data packet including known data in each of a predetermined number of data packets, the present invention may enhance the receiving performance of the receiving system in an environment undergoing frequent channel changes.

Also, by applying any one of a SCCC mode, a PCCC mode, a variable SCCC mode, and a hybrid mode for the mobile service data, and by enabling the transmitting system to perform turbo-encoding, and by enabling the receiving system to perform regressive turbo-decoding, the present invention may also enhance the receiving performance of the receiving system in an environment undergoing frequent channel changes. Furthermore, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A receiving system comprising:
   a receiving unit receiving a broadcast signal including a first group comprising mobile service data, known data and signaling data, the first group generated by interleaving a second group in a transmitting system, wherein the second group comprises data packets including a portion of the mobile service data, and wherein the data packets are spaced at least one data packet apart;
   a signaling decoder decoding the signaling data from the received broadcast signal;
   a demodulator demodulating the received broadcast signal based upon the known data;
   an equalizer channel-equalizing the demodulated broadcast signal based upon the known data;
   a turbo decoder performing turbo decoding on the mobile service data of the channel-equalized broadcast signal by applying a Serial Concatenated Convolutional Coding (SCCC) mode based upon the signaling data; and
   an error correction unit performing error correction decoding on the turbo-decoded mobile service data based upon the signaling data.

2. The receiving system of claim 1, wherein the turbo decoder comprises:
   an inner decoder matching the mobile service data of the channel-equalized broadcast signal with mobile service data being SCCC outer-decoded, thereby trellis-decoding the matched mobile service data; and
   an SCCC outer decoder performing SCCC outer-decoding on the trellis-decoded mobile service data, thereby feeding-back the SCCC outer-decoded mobile service data to the inner decoder,
   wherein the inner decoder and the SCCC outer decoder respectively repeat trellis-decoding and SCCC outer-decoding processes on the input mobile service data as many times as a pre-determined number of repetitions.

3. The receiving system of claim 2, wherein the inner decoder comprises:
   12 soft input soft output (SISO) trellis decoders each performing trellis-decoding by applying an SISO decoding algorithm.

4. The receiving system of claim 1, wherein the turbo decoder comprises:
   N number of decoders formed in parallel each including M number of soft input soft output (SISO) decoders,
   wherein each of the (N×M) number of SISO decoders repeatedly performs SISO decoding on the input mobile service data as many times as a pre-determined number of repetitions.

5. The receiving system of claim 4, wherein (N×M) is equal to '12'.

6. The receiving system of claim 1, wherein the turbo decoder comprises:
   a soft input soft output (SISO)12-way inner decoder matching the mobile service data of the channel-equalized broadcast signal with mobile service data being SCCC outer-decoded, thereby inner-decoding the matched mobile service data; and
   an SCCC outer decoder performing SCCC outer-decoding on the inner-decoded mobile service data, thereby feeding-back the SCCC outer-decoded mobile service data to the SISO 12-way inner decoder, wherein the SISO 12-way inner decoder and the SCCC outer decoder respectively repeat inner-decoding and SCCC outer-decoding processes on the input mobile service data as many times as a pre-determined number of repetitions.

7. A data processing method in a receiving system, the method comprising:

receiving a broadcast signal including a first group comprising mobile service data, known data and signaling data, the first group generated by interleaving a second group in a transmitting system, wherein the second group comprises data packets including a portion of the mobile service data, and wherein the data packets are spaced at least one data packet apart;

decoding the signaling data from the received broadcast signal;

demodulating the received broadcast signal based upon the known data;

channel-equalizing the demodulated broadcast signal based upon the known data;

performing turbo decoding on the mobile service data of the channel-equalized broadcast signal by applying a Serial Concatenated Convolutional Coding (SCCC) mode based upon the signaling data; and performing error correction decoding on the turbo-decoded mobile service data based upon the signaling data.

* * * * *